(12) United States Patent
Kawamura

(10) Patent No.: US 11,984,699 B2
(45) Date of Patent: May 14, 2024

(54) OPTICAL SEMICONDUCTOR DEVICE AND CONTROL METHOD OF THE SAME

(71) Applicant: SUMITOMO ELECTRIC DEVICE INNOVATIONS, INC., Yokohama (JP)

(72) Inventor: Hiromitsu Kawamura, Yokohama (JP)

(73) Assignee: Sumitomo Electric Device Innovations, Inc., Yokohama (JP)

( * ) Notice: Subject to any disclaimer, the term of this patent is extended or adjusted under 35 U.S.C. 154(b) by 786 days.

(21) Appl. No.: 17/049,512

(22) PCT Filed: Apr. 23, 2019

(86) PCT No.: PCT/JP2019/017263
§ 371 (c)(1),
(2) Date: Oct. 21, 2020

(87) PCT Pub. No.: WO2019/208575
PCT Pub. Date: Oct. 31, 2019

(65) Prior Publication Data
US 2021/0242658 A1 Aug. 5, 2021

(30) Foreign Application Priority Data

Apr. 26, 2018 (JP) ................ 2018-085695
Jan. 16, 2019 (JP) ................ 2019-005113

(51) Int. Cl.
H01S 5/0239 (2021.01)
H01S 5/00 (2006.01)
(Continued)

(52) U.S. Cl.
CPC .......... *H01S 5/0239* (2021.01); *H01S 5/0071* (2013.01); *H01S 5/141* (2013.01); *H01S 5/0683* (2013.01)

(58) Field of Classification Search
CPC ...... H01S 5/0239; H01S 5/0071; H01S 5/141; H01S 5/0683; H01S 5/02208;
(Continued)

(56) References Cited

U.S. PATENT DOCUMENTS 6,178,002 B1 * 1/2001 Mueller-Wirts .......... G01J 9/02
356/519
6,233,263 B1 * 5/2001 Chang-Hasnain .... H01S 5/0264
372/9
(Continued)

FOREIGN PATENT DOCUMENTS

EP 1432088 A1 6/2004
JP 2010-034114 A 2/2010
(Continued)

Primary Examiner — Vu A Vu
(74) Attorney, Agent, or Firm — McCarter & English, LLP; Michael A. Sartori

(57) ABSTRACT

Provided is an optical semiconductor device including: a wavelength tunable laser element; a beam splitter that splits an outgoing beam of the wavelength tunable laser element into a first light beam and a second light beam parallel to each other, and outputs the first light beam and the second light beam; and an etalon that transmits the first light beam and the second light beam, wherein an optical path length to the first light beam of the etalon is different from an optical path length to the second light beam of the etalon.

4 Claims, 15 Drawing Sheets

(51) Int. Cl.
*H01S 5/14* (2006.01)
*H01S 5/0683* (2006.01)

(58) Field of Classification Search
CPC ............. H01S 5/02325; H01S 5/02415; H01S 5/02438; H01S 5/0261; H01S 5/0617; H01S 5/0687
USPC .......................................................... 372/20
See application file for complete search history.

(56) References Cited

U.S. PATENT DOCUMENTS

| | | | | |
|---|---|---|---|---|
| 6,822,979 | B2 * | 11/2004 | Daiber | H01S 5/141 |
| | | | | 372/18 |
| 6,940,879 | B2 * | 9/2005 | Zhang | H01S 3/08031 |
| | | | | 372/20 |
| 6,973,228 | B2 * | 12/2005 | Chang | H04B 10/572 |
| | | | | 398/198 |
| 7,327,472 | B2 * | 2/2008 | Riza | G01K 5/52 |
| | | | | 356/519 |
| 7,420,686 | B2 * | 9/2008 | Tan | G01J 3/36 |
| | | | | 356/454 |
| 7,633,624 | B1 * | 12/2009 | Wickholm | G01B 9/02058 |
| | | | | 356/450 |
| 10,050,405 | B2 * | 8/2018 | Xiong | H01S 3/08036 |
| 2006/0050747 | A1 * | 3/2006 | Trutna, Jr. | H01S 5/141 |
| | | | | 372/20 |
| 2015/0076990 | A1 | 3/2015 | Uesaka et al. | |
| 2017/0302051 | A1 | 10/2017 | Xiong et al. | |

FOREIGN PATENT DOCUMENTS

| | | |
|---|---|---|
| JP | 2014-165384 A | 9/2014 |
| JP | 2015-060961 A | 3/2015 |

* cited by examiner

OPTICAL SEMICONDUCTOR DEVICE AND CONTROL METHOD OF THE SAME

TECHNICAL FIELD

The present disclosure relates to an optical semiconductor device and a control method of the same.

BACKGROUND ART

A wavelength tunable laser that allows selection of the output wavelength is disclosed (for example, see Patent Document 1).

PRIOR ART DOCUMENT

Patent Document

Patent Document 1: Japanese Patent Application Publication No. 2010-034114

SUMMARY OF THE INVENTION

An optical semiconductor device in accordance with the present disclosure includes: a wavelength tunable laser element; a beam splitter that splits an outgoing beam of the wavelength tunable laser element into a first light beam and a second light beam parallel to each other, and outputs the first light beam and the second light beam; and an etalon that transmits the first light beam and the second light beam, wherein an optical path length to the first light beam of the etalon is different from an optical path length to the second light beam of the etalon.

An optical semiconductor device in accordance with the present disclosure includes: a wavelength tunable laser element; a beam splitter that splits an outgoing beam of the wavelength tunable laser element into a first light beam and a second light beam, and outputs the first light beam and the second light beam; and an etalon that transmits the first light beam and the second light beam, wherein the first light beam enters the etalon from a first direction, and forms a first optical path in the etalon, the second light beam enters the etalon from a second direction different from the first direction, and forms a second optical path in the etalon, and an optical path length of the first optical path is different from an optical path length of the second optical path.

An optical semiconductor device in accordance with the present disclosure includes: a wavelength tunable laser element; a beam splitter that splits an outgoing beam of the wavelength tunable laser element into a first light beam and a second light beam, and outputs the first light beam and the second light beam; a polarizer that makes a polarization state of one of the first light beam and the second light beam different from a polarization state of the other of the first light beam and the second light beam by changing a polarization state of at least one of the first light beam and the second light beam; and an etalon that transmits the first light beam and the second light beam that have passed through the polarizer, wherein the etalon is composed of a material that has a unique refractive index corresponding to a polarized wave of a light beam entering the etalon.

A control method of an optical semiconductor device in accordance with the present disclosure is a control method of an optical semiconductor device, the optical semiconductor device including a wavelength tunable laser element, a beam splitter that splits an outgoing beam of the wavelength tunable laser element into a first light beam and a second light beam parallel to each other and outputs the first light beam and the second light beam, an etalon that transmits the first light beam and the second light beam, a first detection unit that receives the first light beam that has passed through the etalon, a second detection unit that receives a second light beam that has passed through the etalon, and a third detection unit that receives another second light beam before passing through the etalon, wherein an optical path length to the first light beam of the etalon is different from an optical path length to the second light beam of the etalon, and the control method includes: a step of driving the wavelength tunable laser element in a driving condition corresponding to a target wavelength of the outgoing beam of the wavelength tunable laser element, and a step of selecting a target wavelength with use of a detection result of one of the first detection unit and the second detection unit and a detection result of the third detection unit.

MODES FOR CARRYING OUT THE INVENTION

Figure 1A:
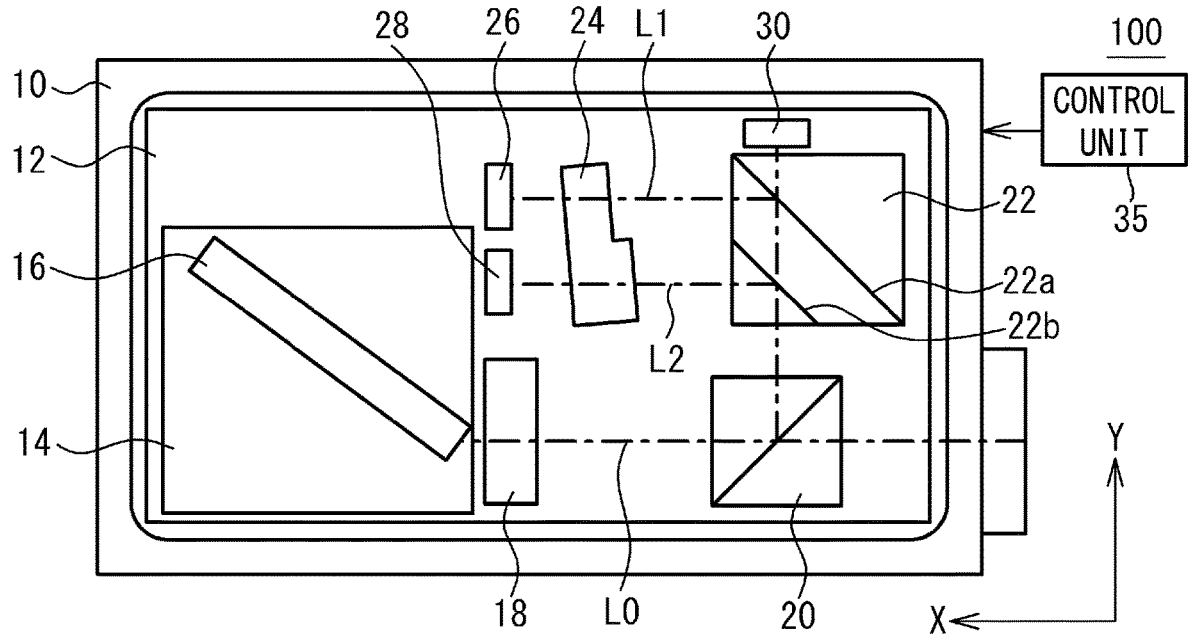
FIG. 1A is a plan view illustrating an optical semiconductor device in accordance with a first embodiment.

Problems to be Solved by the Present Disclosure

An etalon is used to control the wavelength. The etalon has a periodic transmission characteristic to the wavelength and the frequency of a light. The transmission characteristic of the etalon monotonically increases and monotonically decreases with respect to the wavelength between the peak, which indicates a maximum value, and the bottom, which indicates a minimal value, but does not monotonically increase nor monotonically decrease around the peak and the bottom. Therefore, the wavelength control is difficult. Thus, it is an objective to provide an optical semiconductor device and a control method of the same that allows stable wavelength control.

Effects of the Present Disclosure

According to the present disclosure, stable wavelength control is possible.

DESCRIPTION OF EMBODIMENTS OF THE PRESENT DISCLOSURE

First, details of embodiments of the present disclosure will be described as listed below.

An embodiment of the present disclosure is (1) an optical semiconductor device including: a wavelength tunable laser element; a beam splitter that splits an outgoing beam of the wavelength tunable laser element into a first light beam and a second light beam parallel to each other, and outputs the first light beam and the second light beam; and an etalon that transmits the first light beam and the second light beam, wherein an optical path length to the first light beam of the etalon is different from an optical path length to the second light beam of the etalon. This structure allows the transmission characteristics of one etalon to be adjusted and reduces production tolerance and variation in assembly. Thus, stable wavelength control becomes possible.

(2) The etalon may include a first part that determines the optical path length to the first light beam, and a second part that determines the optical path length to the second light beam, and a thickness of the first part may be different from a thickness of the second part. Since the thickness of the etalon changes, the optical path length of the first light beam becomes greater than the optical path length of the second light beam. Thus, stable wavelength control is possible.

(3) An optical semiconductor device includes: a wavelength tunable laser element; a beam splitter that splits an outgoing beam of the wavelength tunable laser element into a first light beam and a second light beam, and outputs the first light beam and the second light beam; and an etalon that transmits the first light beam and the second light beam, wherein the first light beam enters the etalon from a first direction, and forms a first optical path in the etalon, the second light beam enters the etalon from a second direction different from the first direction, and forms a second optical path in the etalon, and an optical path length of the first optical path is different from an optical path length of the second optical path. This structure allows the transmission characteristics of one etalon to be adjusted, and reduces production tolerance and variation in assembly. Thus, stable wavelength control becomes possible.

(4) The beam splitter may include a first reflecting surface and a second reflecting surface, and the first reflecting surface may output, as the first light beam, a part of the outgoing beam in the first direction, and the second reflecting surface may output, as the second light beam, another part of the outgoing beam in the second direction. This structure forms the first light beam and the second light beam that are nonparallel to each other, and allows the incidence angles to the etalon to be different from each other.

(5) An optical semiconductor device includes: a wavelength tunable laser element; a beam splitter that splits an outgoing beam of the wavelength tunable laser element into a first light beam and a second light beam, and outputs the first light beam and the second light beam; a polarizer that makes a polarization state of one of the first light beam and the second light beam different from a polarization state of the other of the first light beam and the second light beam by changing a polarization state of at least one of the first light beam and the second light beam; and an etalon that transmits the first light beam and the second light beam that have passed through the polarizer, wherein the etalon is composed of a material that has a refractive index unique to a polarization state of a light beam entering the etalon. This structure allows the transmission characteristics of one etalon to be adjusted, and reduces production tolerance and variation in assembly. Thus, stable wavelength control becomes possible.

(6) The polarizer may include a first polarizer and a second polarizer, and the first polarizer may change a polarization state of the first light beam, the second polarizer may change a polarization state of the second light beam to a polarization state different from that of the first light beam. Since the polarization states of the first light beam and the second light beam can be adjusted, more stable wavelength control is possible.

(7) The beam splitter may include a reflecting surface that reflects the outgoing beam, and the polarizer may be provided on the reflecting surface. This structure allows more stable wavelength control.

(8) The etalon may have a uniform thickness. The transmission characteristic of the etalon can be adjusted by the first light beam and the second light beam with different incidence angles entering the etalon having a uniform thickness.

(9) The beam splitter may include a first reflecting surface that directs the outgoing beam toward a first axis and outputs the first light beam, and a second reflecting surface that directs the outgoing beam toward a second axis and outputs the second light beam, and the first axis and the second axis may be parallel to each other, and may be different from an optical axis of the outgoing beam. This structure forms the first light beam and the second light beam that are parallel to each other, allowing the incidence angles to the etalon to be equal to each other.

(10) The reflecting surface may transmit a part of the outgoing beam to output a third light beam. The intensity of the third light beam that is not transmitted through the etalon is detected, and the wavelength is controlled based on the ratio of the intensities of the third light beam and the first light beam and the ratio of the intensities of the third light beam and the second light beam.

(11) A control method of an optical semiconductor device, the optical semiconductor device including a wavelength tunable laser element, a beam splitter that splits an outgoing beam of the wavelength tunable laser element into a first light beam and a second light beam parallel to each other and outputs the first light beam and the second light beam, an etalon that transmits the first light beam and the second light beam, a first detection unit that receives the first light beam that has passed through the etalon, a second detection unit that receives a second light beam that has passed through the etalon, and a third detection unit that receives another second light beam before passing through the etalon, wherein an optical path length to the first light beam of the etalon is different from an optical path length to the second light beam of the etalon, and the control method includes: a step of driving the wavelength tunable laser element in a driving condition corresponding to a target wavelength of the outgoing beam of the wavelength tunable laser element, and a step of selecting a target wavelength with use of a detection result of one of the first detection unit and the second detection unit and a detection result of the third detection unit. Stable wavelength control becomes possible.

(12) The optical semiconductor device may further include a memory that stores driving information of the wavelength tunable laser element, and the step of selecting the target wavelength may include a step of selecting, based on the target wavelength, which of the detection result of the first detection unit and the detection result of the second detection unit stored in the memory is to be used. This enables stable wavelength control.

DETAILS OF EMBODIMENTS OF THE PRESENT DISCLOSURE

The following describes specific examples of an optical semiconductor device and a control method of the same in accordance with embodiments of the present disclosure with reference to the drawings. It should be noted that the present disclosure is not limited to these examples but is shown by the claims, and it is intended that all modifications are included in the equivalents of the claims and the scope of the claims.

First Embodiment

FIG. 1A is a plan view illustrating an optical semiconductor device 100 in accordance with a first embodiment. The chain lines represent light beams. The X direction and the Y direction are at right angles to each other. As illustrated in FIG. 1A, the optical semiconductor device 100 includes a package 10, a thermoelectric cooler (TEC) 12, a carrier 14, a wavelength tunable laser element 16, a lens holder 18, beam splitters 20 and 22, an etalon 24, and light receiving elements 26, 28, and 30.

The upper surface of the package 10 extends in the XY plane, and the TEC 12 is mounted on the upper surface. Mounted on the TEC 12 are the carrier 14, the lens holder 18, the beam splitters 20 and 22, the etalon 24, and the light receiving elements 26, 28, and 30. The wavelength tunable laser element 16 is mounted on the carrier 14.

The lens holder 18 is located at the negative X side of the output end of the wavelength tunable laser element 16, and the beam splitter 20 is located at the negative X side of the lens holder 18. The beam splitter 22 is located at the positive Y side of the beam splitter 20, and the light receiving element 30 is located at the positive Y side of the beam splitter 22. The etalon 24 is located at the positive X side of the beam splitter 22. The light receiving elements 26 and 28 are located at the positive X side of the etalon 24, and are arranged along the Y direction.

The TEC 12 includes a Peltier element, and acts as a temperature control device that controls the temperatures of the wavelength tunable laser element 16 and the etalon 24. The wavelength tunable laser element 16 includes a tunable semiconductor laser that can control the wavelength, and outputs a laser beam L0. The wavelength tunable laser element 16 includes, for example, a sampled grating distributed feedback (SG-DFB) region, a chirped sampled grating distributed Bragg reflector (CSG-DBR) region, and a semiconductor optical amplifier (SOA) region. When carriers are injected into the SG-DFB region, the wavelength tunable laser element 16 oscillates. For example, a heater is disposed in the CSG-DBR region, and input of electric power to the heater changes the temperature in the CSG-DBR region, changing the refractive index. As a result, the wavelength of the laser beam L0 varies. The intensity of the laser beam L0 is adjusted by inputting electric current to the SOA region. The lens holder 18 holds a lens.

The beam splitters 20 and 22 are, for example, cube-type beam splitters. The beam splitter 20 transmits a part of the laser beam L0 output from the wavelength tunable laser element 16 to the negative X side, and reflects another part of the laser beam L0 to the positive Y side. The laser beam L0 transmitted through the beam splitter 20 is an output beam output from the optical semiconductor device 100 to the outside.

The beam splitter 22 has two reflecting surfaces 22a and 22b that are parallel to each other. One of the laser beams L0 split by the beam splitter 20 enters the reflecting surface 22b (a second reflecting surface), and is further split by the reflecting surface 22b. A light beam L2 (a second light beam), which is one of light beams split by the reflecting surface 22b, propagates in the positive X direction, is transmitted through the etalon 24, and enters the light receiving element 28. The light beam transmitted through the reflecting surface 22b enters the reflecting surface 22a (a first reflecting surface), and is split. The light beam L1 (a first light beam), which is one of light beams split by the reflecting surface 22a, propagates in the positive X direction, is transmitted through the etalon 24, and enters the light receiving element 26. The optical axis of the light beam L1 and the optical axis of the light beam L2 are parallel to each other, and are in directions different from the optical axis of the laser beam L0. The light beam transmitted through the reflecting surfaces 22b and 22a enters the light receiving element 30.

The etalon 24 is formed of, for example, crystal. The transmissivity of the etalon 24 changes periodically according to the wavelength of incident light. The light receiving elements 26, 28, and 30 are, for example, photodiodes, and output electric current by receiving light.

Figure 1B:
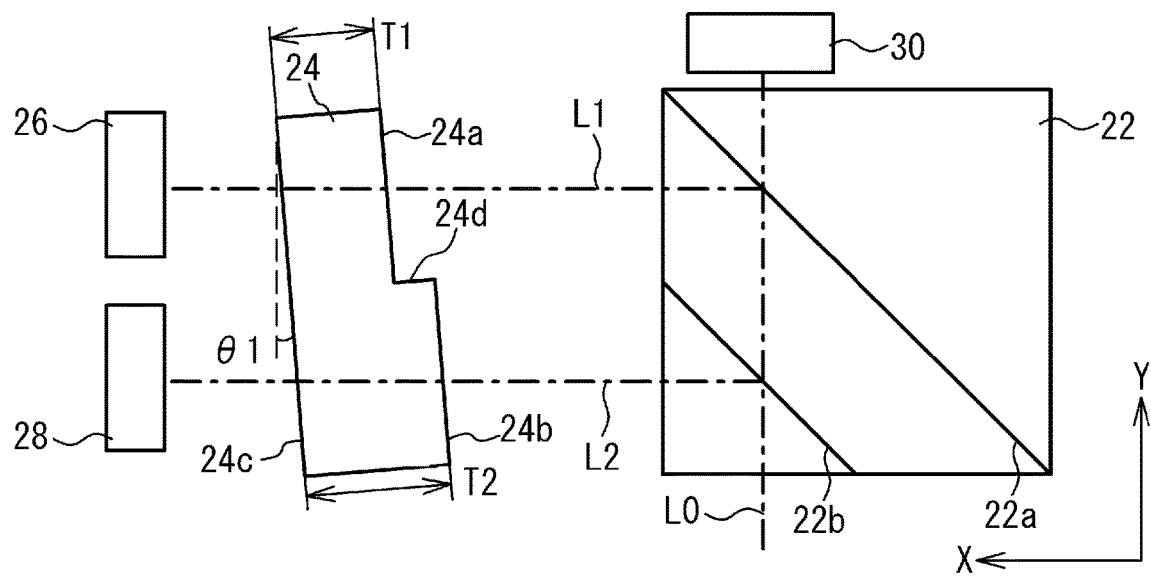
FIG. 1B is an enlarged view of an etalon and a beam splitter.

FIG. 1B is an enlarged view of the etalon 24 and the beam splitter 22. As illustrated in FIG. 1B, the etalon 24 is inclined against the X-axis and the Y-axis, and the angle between the etalon 24 and the Y-axis is $\theta 1$. The surface 24c of the etalon 24 is a flat surface facing the light receiving elements 26 and 28. The surfaces 24a and 24b are the surfaces opposite from the surface 24c, and face the beam splitter 22. The surface 24a is located at the positive X side of the reflecting surface 22a of the beam splitter 22, and the light beam L1 enters the surface 24a. The surface 24b is located at the positive X side of the reflecting surface 22b, and the light beam L2 enters the surface 24b. The light beam L1 and the light beam L2 formed by the reflecting surfaces 22a and 22b, which are parallel to each other, are parallel to each other. Thus, the incidence angle of the light beam L1 to the etalon 24 is equal to the incidence angle of the light beam L2, and is θl.

A level difference 24d is formed between the surface 24a and the surface 24b. The thickness of the etalon 24 changes at the level difference 24d as a border, and the thickness T2 between the surface 24b and the surface 24c is greater than the thickness T1 between the surface 24a and the surface 24c. Thus, the optical path length of the light beam L1 in the etalon 24 is smaller than the optical path length of the light beam L2 in the etalon 24. Thus, the optical path length of the part determined by the light beam L1 in the etalon 24 is smaller than the optical path length of the part determined by the light beam L2 in the etalon 24.

The light receiving element 30 receives a light beam that is not transmitted through the etalon 24, and outputs a photocurrent Im3. The light receiving element 26 receives the light beam L1 transmitted through the part between the surface 24a and the surface 24c of the etalon 24, and outputs a photocurrent Im1. The light receiving element 28 receives the light beam L2 transmitted through the part between the surface 24b and the surface 24c of the etalon 24, and outputs a photocurrent Im2. The photocurrent changes depending on the intensity of each light beam. The ratio of the photocurrent Im1 and the photocurrent Im3 corresponds to the ratio of the intensities of the light beams L1 and L3, and the ratio of Im2 and Im3 corresponds to the ratio of the intensities of the light beams L2 and L3. The wavelength is controlled based on these ratios.

The control unit 35 is an electronic device electrically connected to the TEC 12, the wavelength tunable laser element 16, and the light receiving element, outputs electric signals to the TEC 12 and the wavelength tunable laser element 16, and detects a photocurrent output from the light receiving element. When the control unit 35 inputs electric power to a heater (not illustrated) of the wavelength tunable laser element 16, the temperature of the wavelength tunable laser element 16 varies, and the oscillation wavelength varies. In addition, when the control unit 35 inputs an electric current to the SOA region of the wavelength tunable laser element 16, the intensity of the outgoing beam of the wavelength tunable laser element 16 varies. The control unit 35 includes a memory, and the memory stores transmissivities corresponding to wavelengths.

Figure 2A:
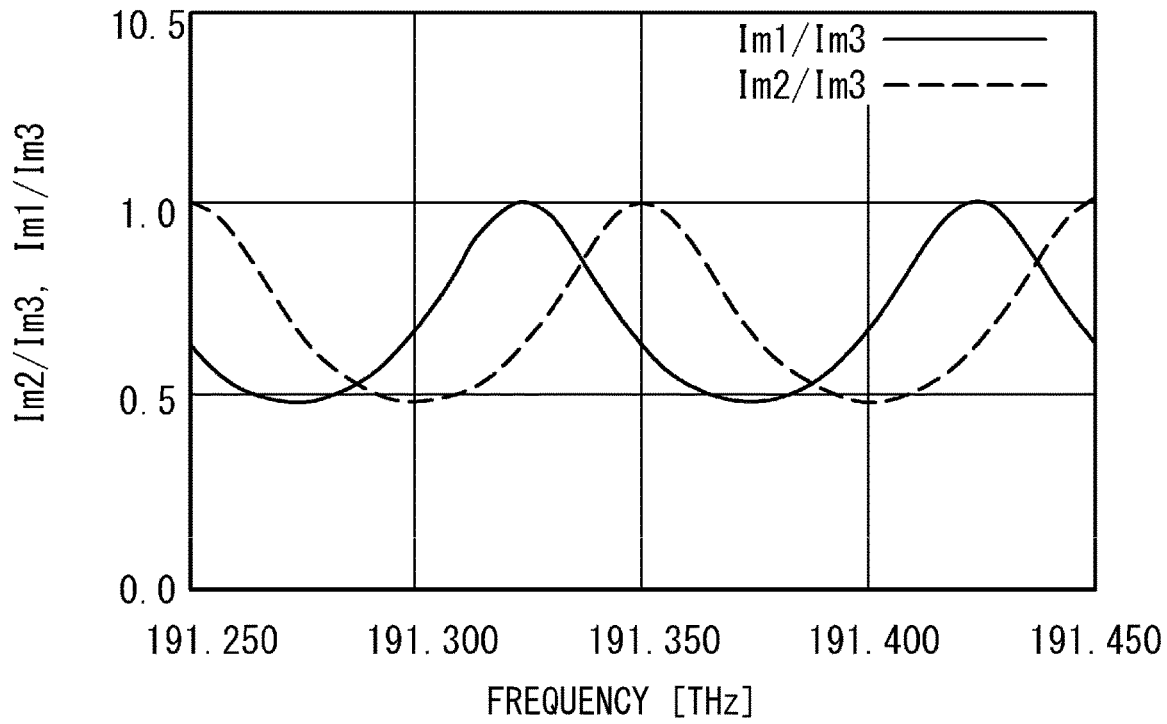
FIG. 2A illustrates the transmission characteristics of the etalon.
Figure 2B:
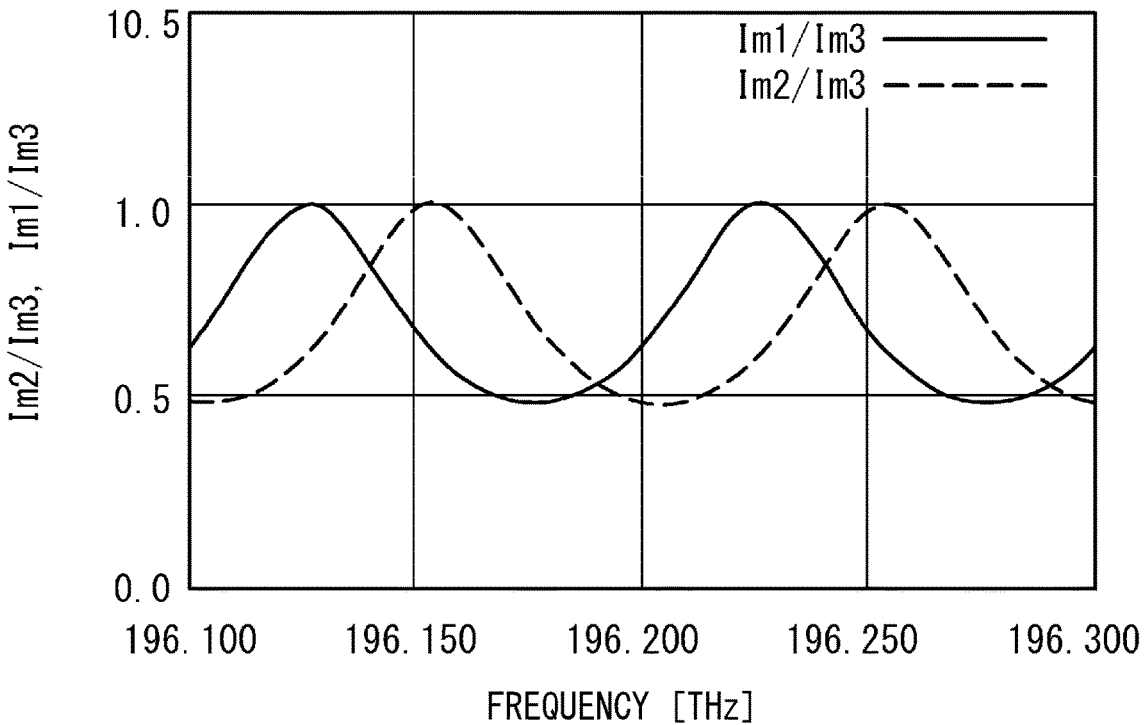
FIG. 2B illustrates the transmission characteristics of the etalon.

FIG. 2A and FIG. 2B illustrate the transmission characteristics of the etalon 24. The transmission characteristics of the etalon 24 are determined by the optical path length of the light beam in the etalon 24 (the resonator length of the etalon 24), the refractive index of the etalon 24, and the incidence angle of the light beam. In the first embodiment, by making the optical path lengths of the light beam L1 and the light beam L2 different from each other, desired transmission characteristics as illustrated in FIG. 2A and FIG. 2B are achieved, and stable wavelength control becomes possible. Prior to description of the transmission characteristics in the first embodiment, comparative examples will be described.

First Comparative Example

Figure 3:
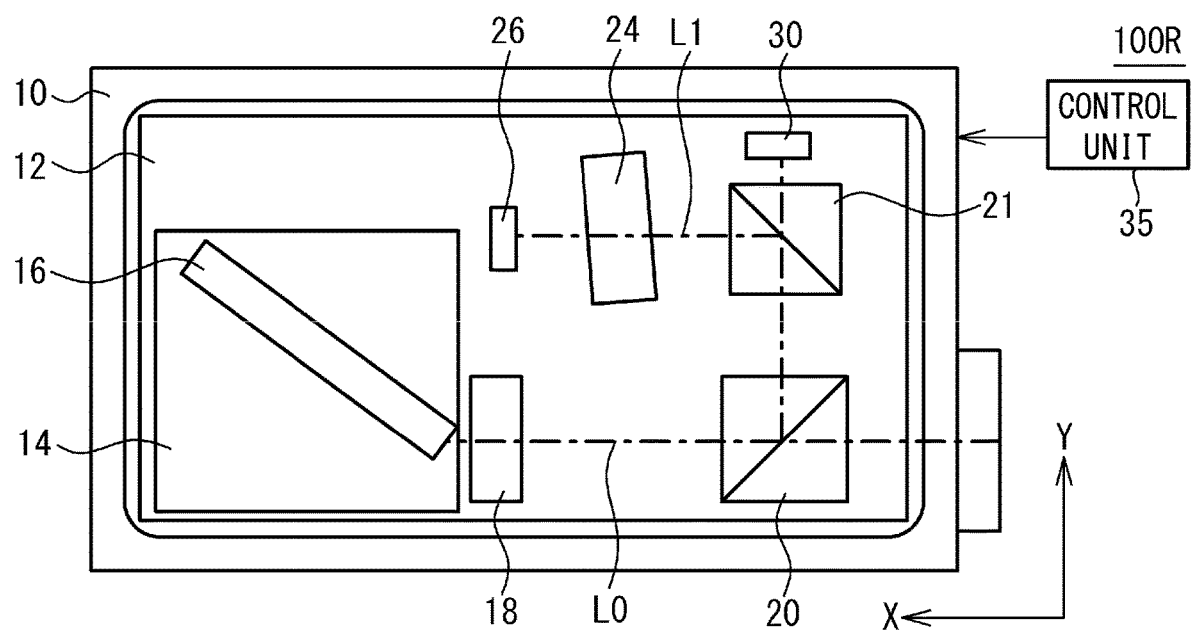
FIG. 3 is a plan view illustrating an optical semiconductor device in accordance with a first comparative example.

FIG. 3 is a plan view illustrating an optical semiconductor device 100R in accordance with a first comparative example. As illustrated in FIG. 3, a beam splitter 21 is located at the positive Y side of the beam splitter 20, and has one reflecting surface. The light receiving element 30 is located at the positive Y side of the beam splitter 20, and receives the light beam transmitted through the beam splitter 20. The etalon 24 and the light receiving element 26 are located at the positive X side of the beam splitter 21, and the light beam L1 enters the etalon 24.

Figure 4A:
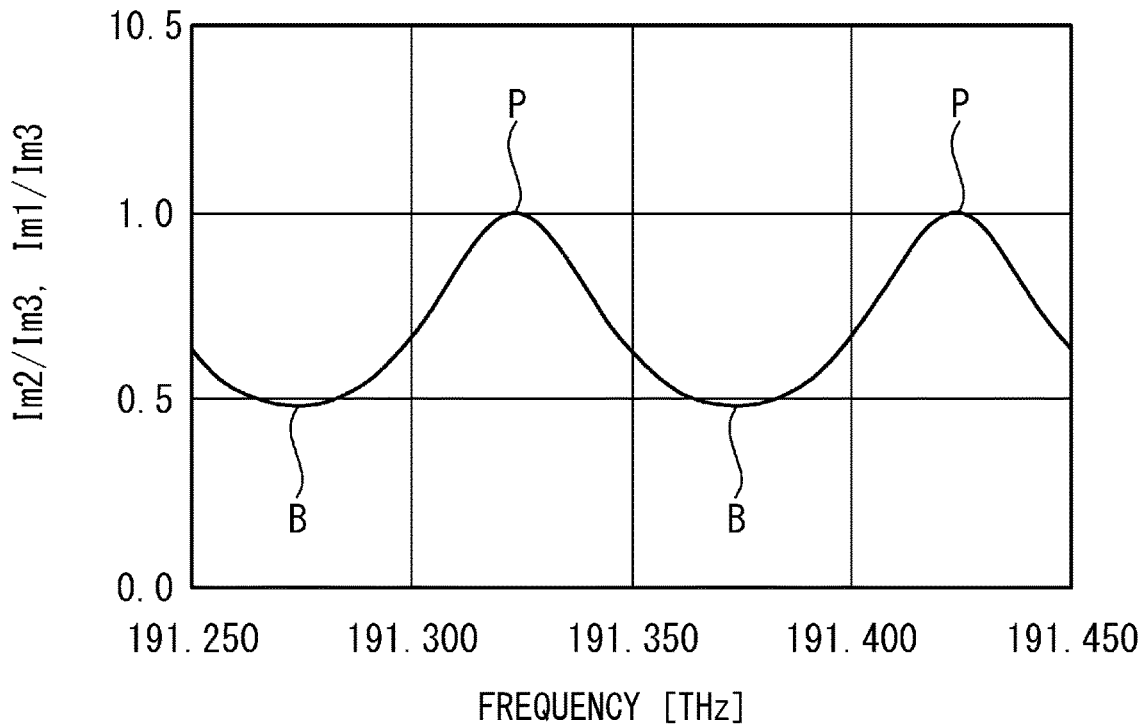
FIG. 4A illustrates the transmission characteristics of the etalon.
Figure 4B:
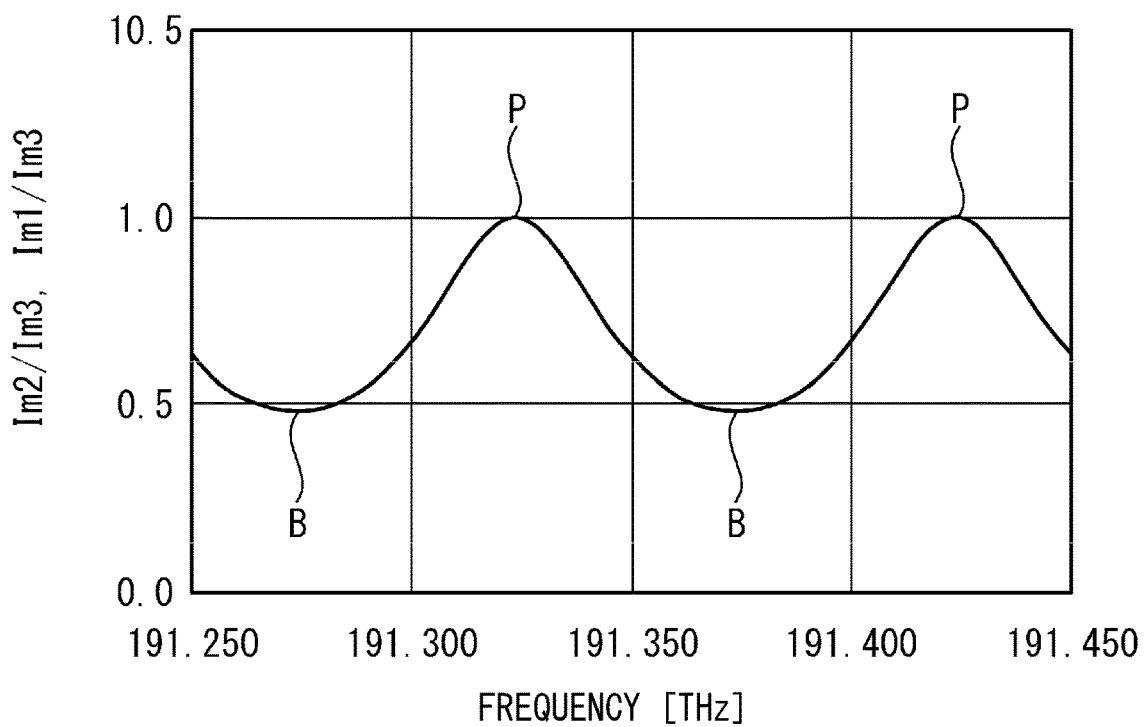
FIG. 4B illustrates the transmission characteristics of the etalon.

FIG. 4A and FIG. 4B illustrate the transmission characteristics of the etalon 24. The horizontal axis represents frequency of the light beam, and FIG. 4A presents a range of 191.250 THz to 191.450 THz, and FIG. 4B presents a range of 196.100 THz to 196.300 THz. The vertical axis represents a ratio of photocurrents Im1/Im3, and represents the transmission characteristics of the etalon 24. As illustrated in FIG. 4A and FIG. 4B, the ratio Im1/Im3, i.e., the transmission characteristic periodically changes with respect to the frequency and the wavelength. That is, peaks P, at which the ratio has the maximum value, and bottoms B, at which the ratio has the minimal value, are alternately arranged. By making the ratio Im1/Im3 have a desired value, a laser beam having a target frequency, i.e., a target wavelength can be output.

Between the peak P and the bottom B, the ratio monotonically increases or monotonically decreases with increase in the frequency. Thus, the wavelength control based on the ratio is easy. However, around the peak P and around the bottom B, the ratio does not monotonically increase nor monotonically decrease. That is, around the peak P, there are a part where the ratio increases with increase in frequency and a part where the ratio decreases with increase in frequency across the maximum value. Around the bottom B, there are an increase part and a decrease part across the minimum value. Thus, the wavelength control is difficult.

Second Comparative Example

Figure 5:
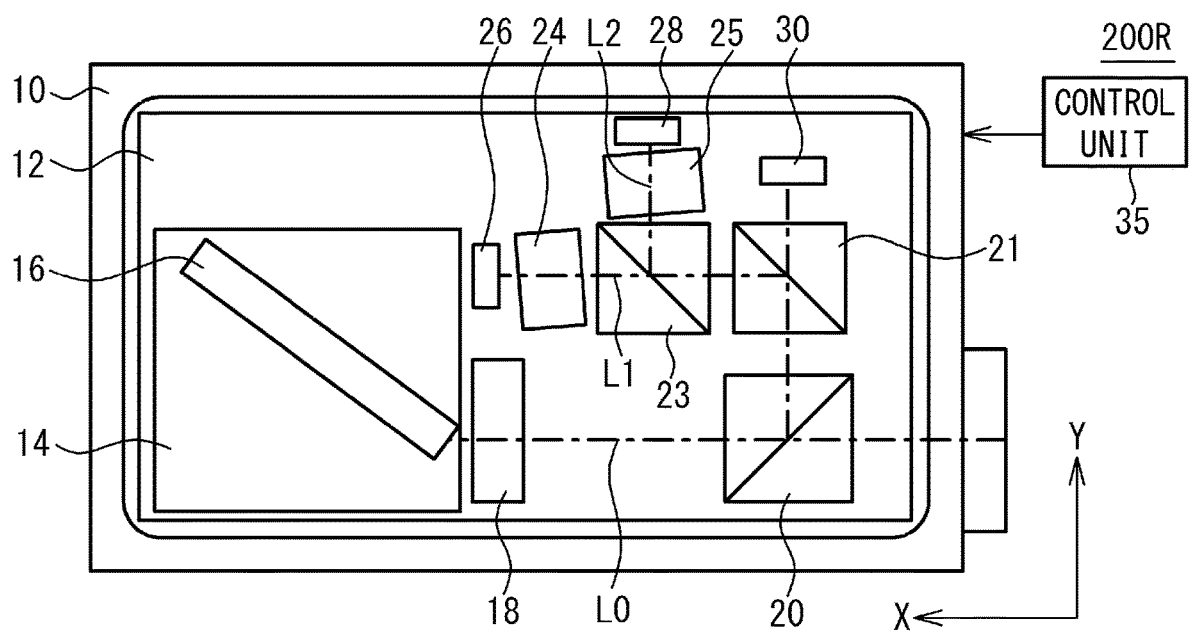
FIG. 5 is a plan view illustrating an optical semiconductor device in accordance with a second comparative example.

FIG. 5 is a plan view illustrating an optical semiconductor device 200R in accordance with a second comparative example. As illustrated in FIG. 5, a beam splitter 23 is disposed at the positive X side of the beam splitter 21, the etalon 24 is disposed at the positive X side of the beam splitter 23, and an etalon 25 is disposed at the positive Y side of the beam splitter 23. The beam splitter 23 splits the light beam output from the beam splitter 21 into the light beams L1 and L2. The light receiving element 26 receives the light beam L1 transmitted through the etalon 24, while the light receiving element 28 receives the light beam L2 transmitted through the etalon 25.

FIG. 6A to FIG. 8B illustrate the transmission characteristics of the etalons 24 and 25. Solid lines indicate the ratio Im1/Im3, and correspond to the transmission characteristics of the etalon 24. Dashed lines indicate the ratio Im2/Im3, and correspond to the transmission characteristics of the etalon 25.

Figure 6A:
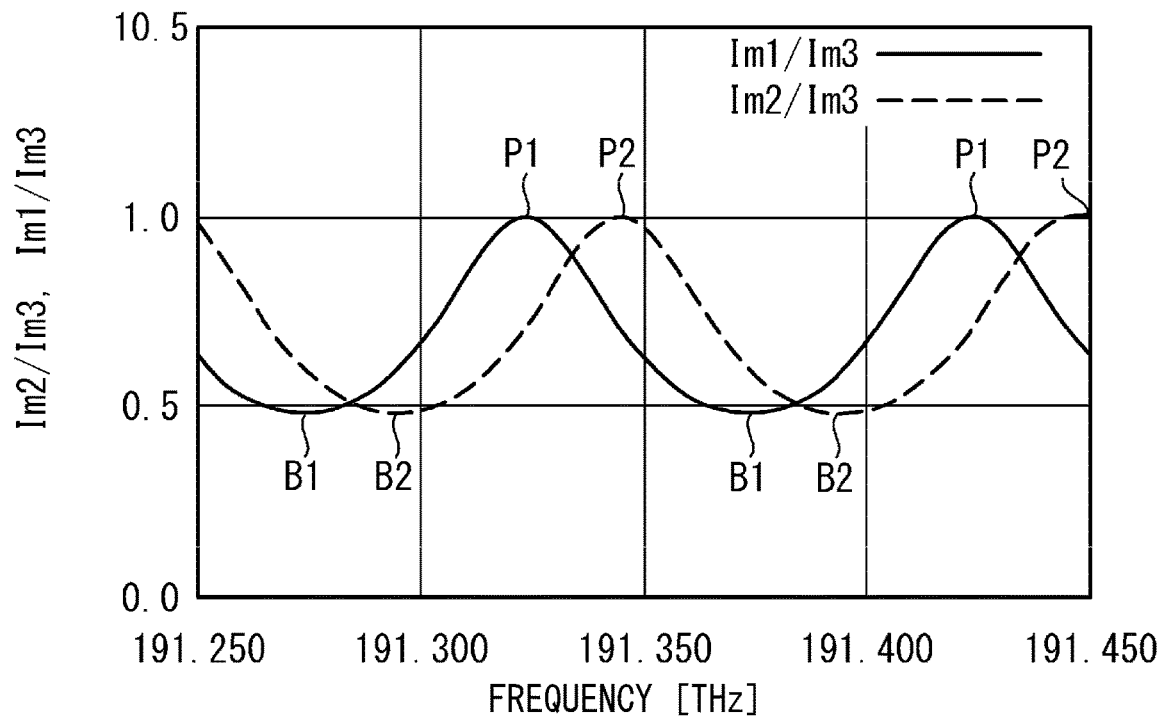
FIG. 6A illustrates the transmission characteristics of the etalon.
Figure 6B:
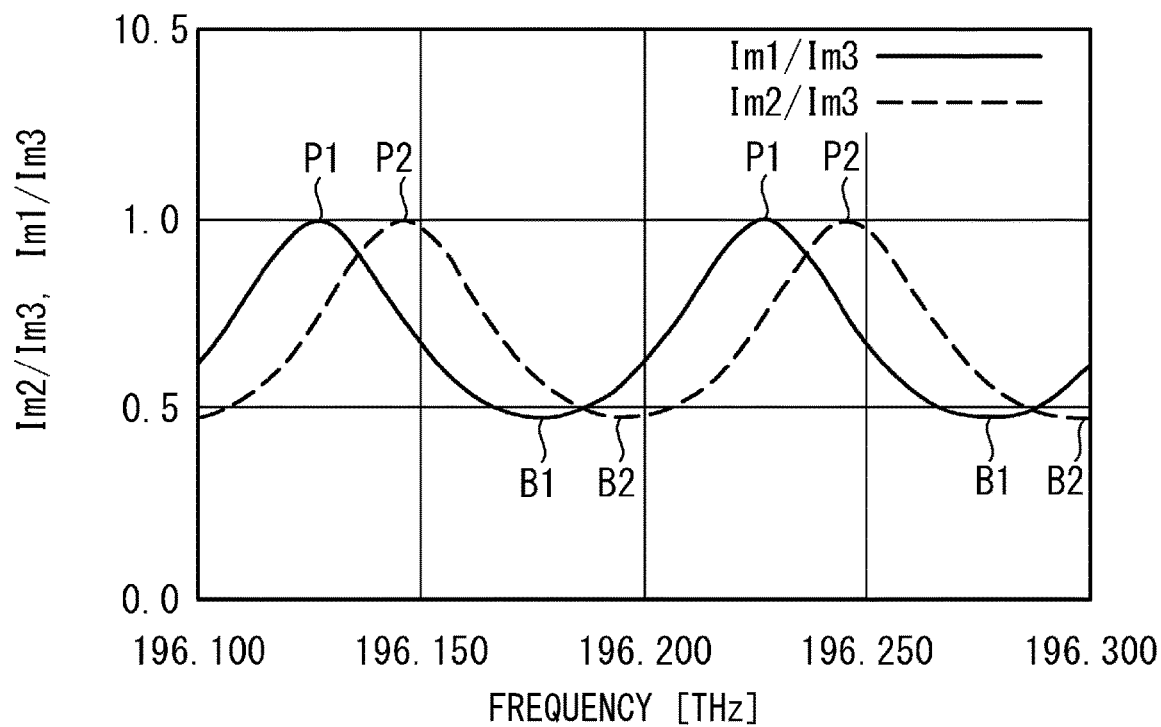
FIG. 6B illustrates the transmission characteristics of the etalon.

As illustrated in FIG. 6A and FIG. 6B, the ratio Im1/Im3 and the ratio Im2/Im3 have substantially identical periods, and are shifted from each other by approximately one-quarter period. Thus, at the frequencies at which the ratio Im1/Im3 is at a peak P1 or a bottom B1, the ratio Im2/Im3 exhibits a monotonic increase or a monotonic decrease. In this case, the wavelength is controlled using the ratio Im2/Im3. In addition, at the frequencies at which the ratio Im2/Im3 is at a peak P2 or a bottom B2, the ratio Im1/Im3 exhibits a monotonic increase or a monotonic decrease. In this case, the wavelength is controlled using the ratio Im1/Im3.

However, since many elements such as two etalons 24 and 25 and the beam splitters 20, 21, and 23 are used, it is difficult to adjust the transmission characteristics of the two etalons 24 and 25 to those illustrated in FIG. 6A and FIG. 6B because of production tolerance and variation in assembly. There is a possibility that the intended transmission characteristics are not obtained because of, for example, the variation in the thickness of the etalon and the variation in the incidence angle.

Figure 7A:
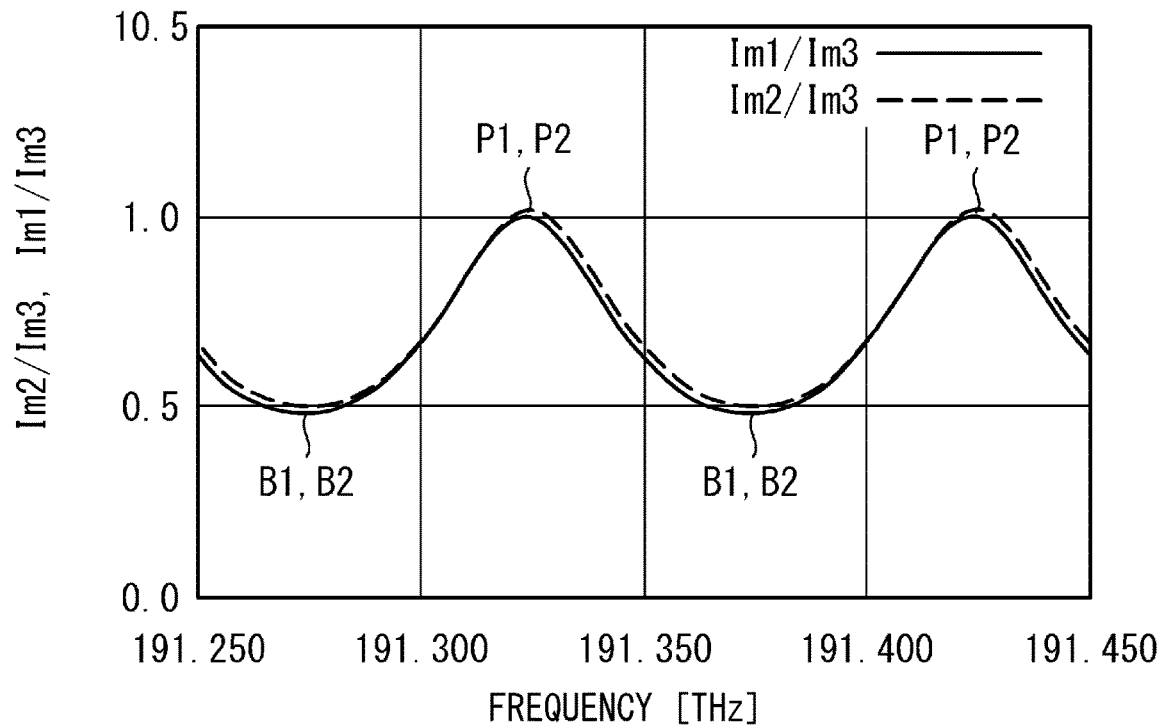
FIG. 7A illustrates the transmission characteristics of the etalon.
Figure 7B:
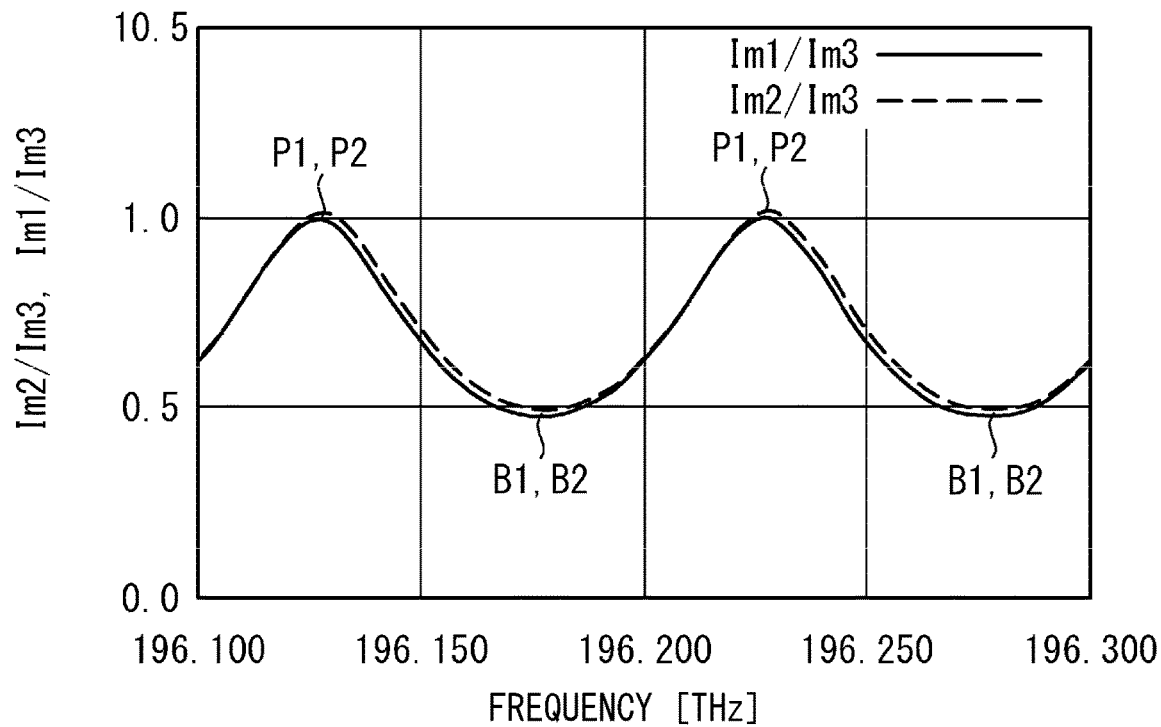
FIG. 7B illustrates the transmission characteristics of the etalon.
Figure 8A:
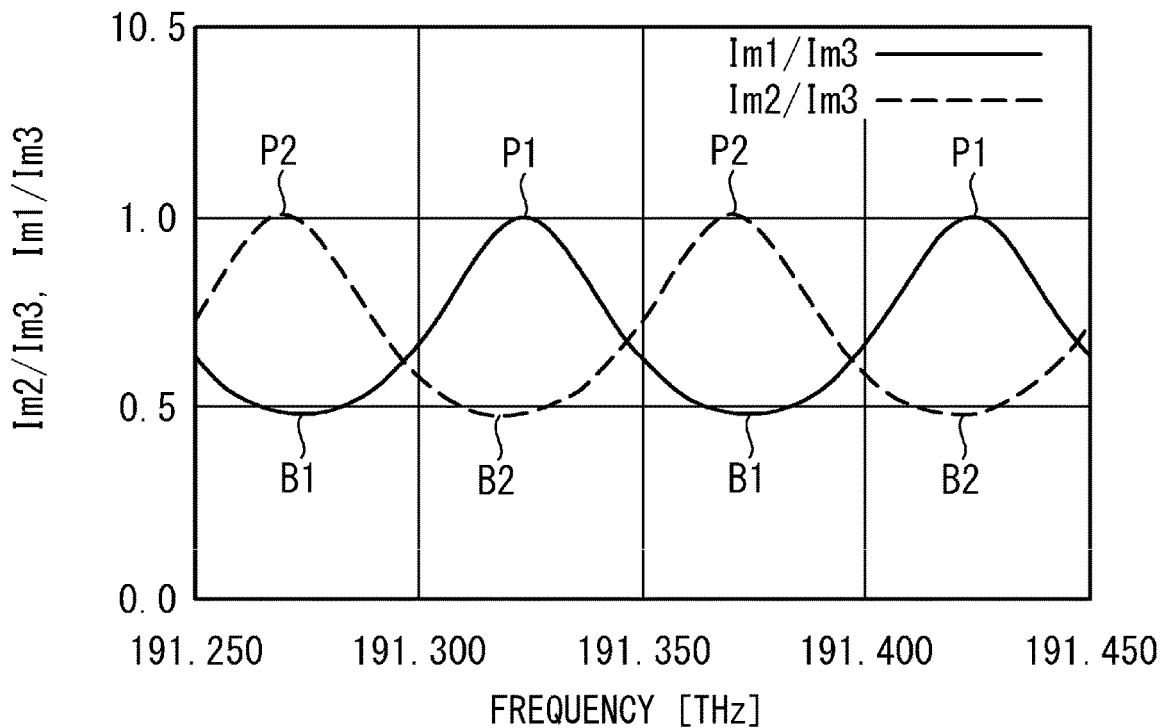
FIG. 8A illustrates the transmission characteristics of the etalon.
Figure 8B:
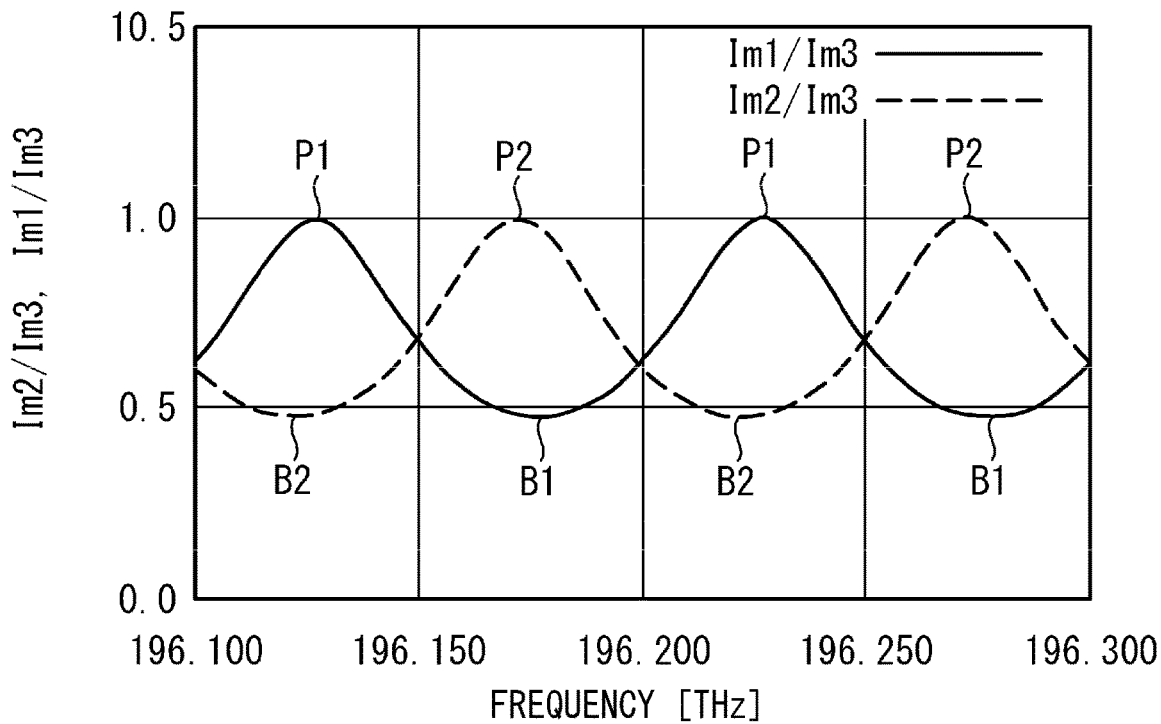
FIG. 8B illustrates the transmission characteristics of the etalon.

In the examples illustrated in FIG. 7A and FIG. 7B, the peak P1 and the peak P2 are at the same frequency, and the bottom B1 and the bottom B2 are at the same frequency. In the examples illustrated in FIG. 8A and FIG. 8B, the peak P1 and the bottom B2 are at the same frequency, and the bottom B1 and the peak P2 are at the same frequency. Thus, whichever of the etalons 24 and 25 is used, it is difficult to control the wavelength.

On the other hand, the first embodiment uses one etalon 24 and the beam splitters 20 and 22 as illustrated in FIG. 1A and FIG. 1B, and therefore, has a simpler structure than the second comparative example. Thus, the production tolerance and the variation in assembly can be reduced. The thicknesses T1 and T2 of the etalon 24 and the angle θ1 of the etalon 24 to the Y-axis can be precisely adjusted, and thereby, the optical path lengths and the incidence angles of the light beams L1 and L2 can be determined more precisely. As described above, the transmission characteristics of the etalon 24 are determined by the optical path length, the incidence angle, and the refractive index. The first embodiment makes the transmission characteristic of the etalon 24 to the light beam L1 different from the transmission characteristic to the light beam L2 by making the optical path lengths of the light beams L1 and L2 different. Thus, stable wavelength control becomes possible.

Table 1 lists examples of the incidence angles of the light beams L1 and L2 to the etalon 24, the thickness of the etalon 24, the refractive index of the etalon 24, and the reflectance of the etalon 24.

TABLE 1

| Light beam | L1 | L2 |
| --- | --- | --- |
| Incidence angle [°] | 1.73 | 1.73 |
| Thickness | 0.97 mm | 0.97 mm + 0.14 μm |
| Refractive index | 1.5443 | 1.5443 |
| Reflectance [%] | 24 | 24 |

As presented in Table 1, for the light beams L1 and L2 the incidence angle, the refractive index, and the reflectance are the same. On the other hand, the thickness (the optical path length) of the part through which the light beam L2 is transmitted of the etalon 24 is 0.97 mm+0.14 μm, and is greater than 0.97 mm, which is the thickness of the part through which the light beam L1 is transmitted of the etalon 24, by 0.14 μm. This structure allows the transmission characteristic of the etalon 24 to the light beam L1 (corresponding to Im1/Im3) and the transmission characteristic of the etalon 24 to the light beam L2 (corresponding to Im2/Im3) to be adjusted to those illustrated in FIG. 2A and FIG. 2B.

In a range of 191.250 to 196.300 THz, the ratio Im1/Im3 and the ratio Im2/Im3 have the same period, and are shifted from each other by approximately one-quarter period. Thus, at the frequencies at which the ratio Im1/Im3 is at the peak P1 or the bottom B1, the ratio Im2/Im3 exhibits a monotonic increase or a monotonic decrease. In this case, the wavelength is controlled using the ratio Im2/Im3. In addition, at the frequencies at which the ratio Im2/Im3 is at the peak P2 or the bottom B2, the ratio Im1/Im3 exhibits a monotonic increase or a monotonic decrease. In this case, the wavelength is controlled using the ratio Im1/Im3.

Figure 9:
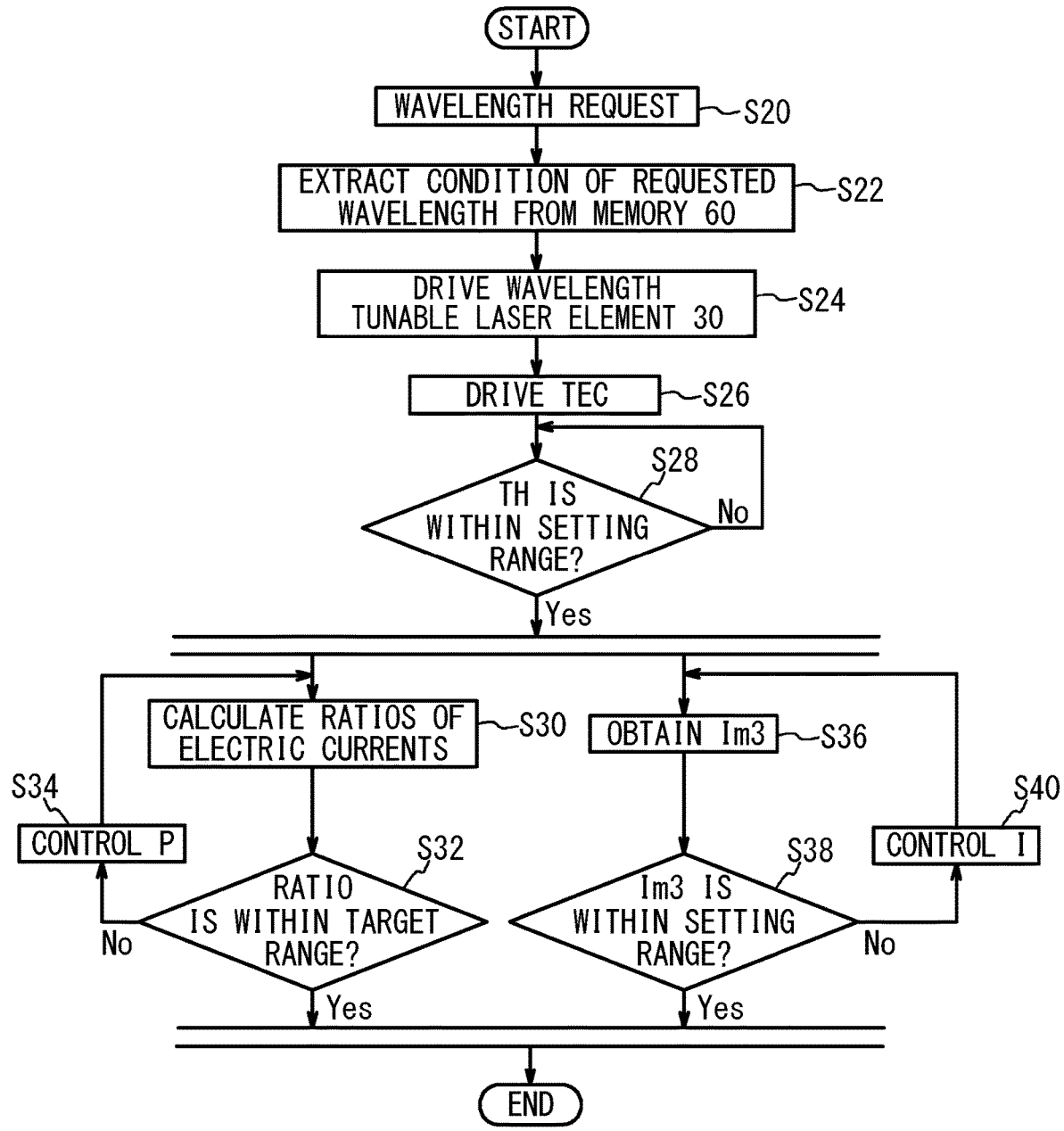
FIG. 9 is a flowchart illustrating a control executed by a control unit.

FIG. 9 is a flowchart illustrating a control executed by the control unit 35. The control unit 35 obtains a wavelength request (step S20). The control unit 35 extracts a control condition corresponding to the target wavelength from the memory (step S22). Then, the control unit 35 drives the wavelength tunable laser element 16 (step S24), and drives the TEC 12 (step S26). The electric current and the electric power at this time are values corresponding to the wavelength request among initial setting values illustrated in FIG. 3.

The control unit 35 determines whether the temperature obtained from a temperature sensor (not illustrated) is within a setting range (step S28). The setting range is a predetermined range centered on the target temperatures of the wavelength tunable laser element 16 and the etalon. When the determination is No, the control unit 35 changes the electric current value supplied to the TEC 12 so that the temperature TH becomes within the setting range. The control unit 35 executes the AFC and the APC in parallel. First, the AFC will be described.

The control unit 35 obtains the electric current Im1 and the electric current Im2 respectively output from the light receiving elements 26 and 28, and the electric current Im3 output from the light receiving element 30, and calculates ratios of these currents (step S30). The wavelength is controlled using one of the ratios Im1/Im3 and Im2/Im3 (the transmissivity). The memory of the control unit 35 stores the values of the ratios corresponding to respective wavelengths, and the ratio exhibiting a monotonic increase or a monotonic decrease is selected from among these ratios by referring to the stored values, and is then used for the AFC.

The control unit 35 determines whether the ratio is within a target range (step S32). The target range is a predetermined range from the values of the ratios Im1/Im3 and Im2/Im3 corresponding to the frequency as illustrated in, for example, FIG. 2A and FIG. 2B.

When the determination is No, the control unit 35 controls, for example, the electric power P input to the heater of the wavelength tunable laser element 16 (step S34). This changes the temperature of the wavelength tunable laser element 16 to adjust the oscillation wavelength to the target wavelength. The wavelength control is possible by setting the ratio within a desired range. When the ratio is within the target range, the desired wavelength is obtained. In this case, the determination becomes Yes, and the control unit 35 continues the AFC so as to maintain the state.

Next, the APC will be described. The control unit 35 obtains the electric current Im3 output from the light receiving element 30 (step S36), and determines whether the electric current Im3 is within a setting range (step S38). The setting range is a predetermined range centered on the target value of the electric current. When the determination is No, the control unit 35 controls the electric current I input to the SOA region of the wavelength tunable laser element 16 (step S40). When the determination is Yes, the control unit 35 continues the APC so as to maintain the state. When the determination is Yes in steps S38 and S48, the control ends.

Since one etalon 24 has different thicknesses T1 and T2, the optical path length of the light beam L1 is made to be different from the optical path length of the light beam L2.

The production tolerance becomes less than that of two etalons, and therefore, stable wavelength control becomes possible.

The beam splitter 22 has the reflecting surfaces 22a and 22b parallel to each other, and emits the light beams L1 and L2 parallel to each other. The incidence angles to the etalon 24 are equal to each other, and the refractive indexes of the etalon 24 to the light beams L1 and L2 are equal to each other. Thus, the transmission characteristic can be adjusted by adjusting mainly the thickness (the optical path length), and stable wavelength control is possible.

Second Embodiment

Figure 10A:
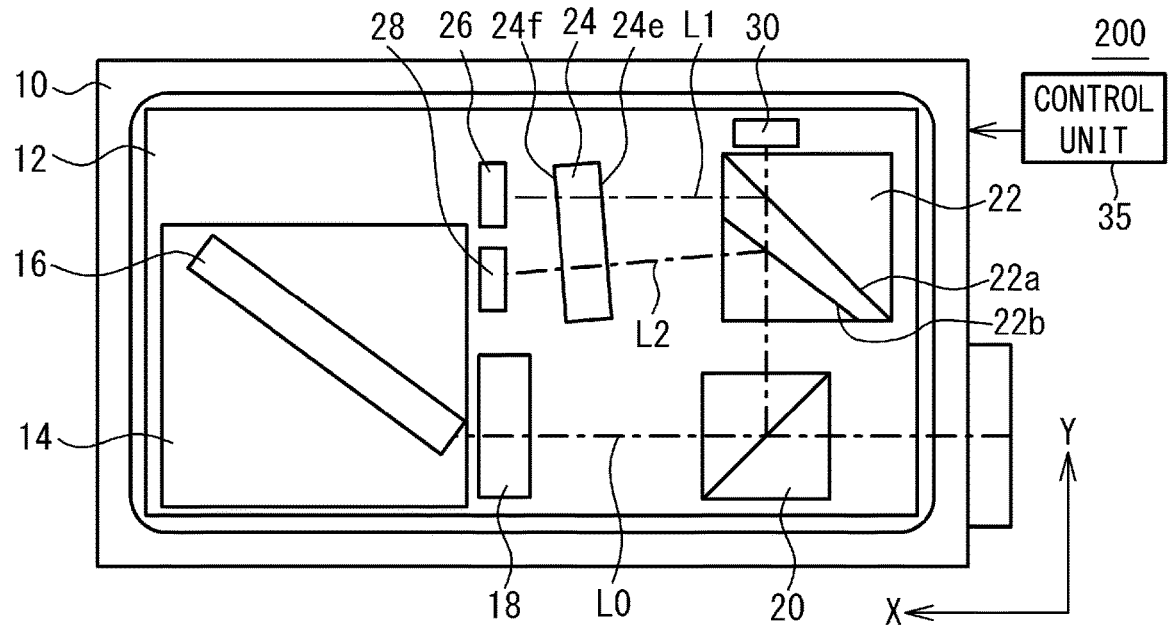
FIG. 10A is a plan view illustrating an optical semiconductor device in accordance with a second embodiment.
Figure 10B:
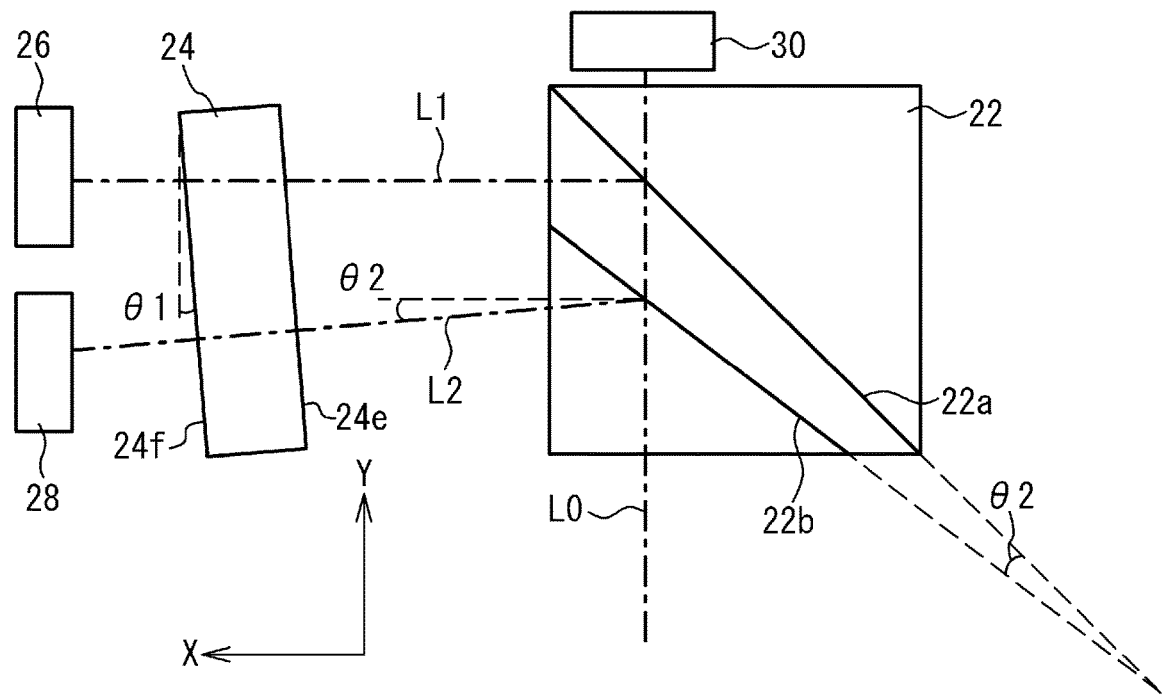
FIG. 10B is an enlarged view of the etalon and the beam splitter.

FIG. 10A is a plan view illustrating an optical semiconductor device 200 in accordance with a second embodiment, and FIG. 10B is an enlarged view of the etalon 24 and the beam splitter 22. The description of the same components as those in the first embodiment is omitted.

As illustrated in FIG. 10A and FIG. 10B, the surface 24e facing the beam splitter 22 of the etalon 24 is flat, and has no level difference formed thereon. That is, the etalon 24 has a uniform thickness. The surface 24f of the etalon 24 is a surface opposite from the surface 24e, and faces the light receiving elements 26 and 28.

The beam splitter 22 has the two reflecting surfaces 22a and 22b. The reflecting surface 22a and the reflecting surface 22b are nonparallel to each other, and the angle between the reflecting surface 22a and the reflecting surface 22b is θ2. Each of the reflecting surfaces 22a and 22b splits an incident beam. The light beam L1 is output from the reflecting surface 22a in the positive X direction. The light beam L2 is output from the reflecting surface 22b in the direction shifted from the positive X direction by angle θ2.

The light beam L1 and the light beam L2 are nonparallel, and the incidence angle of the light beam L1 to the etalon 24 and the incidence angle of the light beam L2 to the etalon 24 are different from each other. The etalon 24 has a uniform thickness, but the incidence angles differ. Thus, the optical path length of the light beam L1 is different from the optical path length of the light beam L2. Hence, the transmission characteristic of the etalon 24 to the light beam L1 is different from the transmission characteristic of the etalon 24 to the light beam L2. In the second embodiment, as in the first embodiment, the production tolerance and the variation in assembly can be reduced, and stable wavelength control is possible.

Table 2 lists examples of the incidence angles of the light beams L1 and L2 to the etalon 24, the thickness of the etalon 24, the refractive index of the etalon 24, and the reflectance of the etalon 24.

TABLE 2

| Light beam | L1 | L2 |
| --- | --- | --- |
| Incidence angle [°] | 1.73 | 1.73 + 0.43 |
| Thickness | 0.97 mm | 0.97 mm |
| Refractive index | 1.5443 | 1.5443 |
| Reflectance [%] | 24 | 24 |

As presented in Table 2, the thicknesses, the refractive indexes, and the reflectances to the light beams L1 and L2 are the same. On the other hand, the incidence angle of the light beam L2 is 1.73+0.43°, and is greater than 1.73°, which is the incidence angle of the light beam L1, by 0.43°. This configuration allows the transmission characteristic of the etalon 24 to the light beam L1 (corresponding to Im1/Im3) and the transmission characteristic of the etalon 24 to the light beam L2 (corresponding to Im2/Im3) to be adjusted to those illustrated in FIG. 11A and FIG. 11B.

Figure 11A:
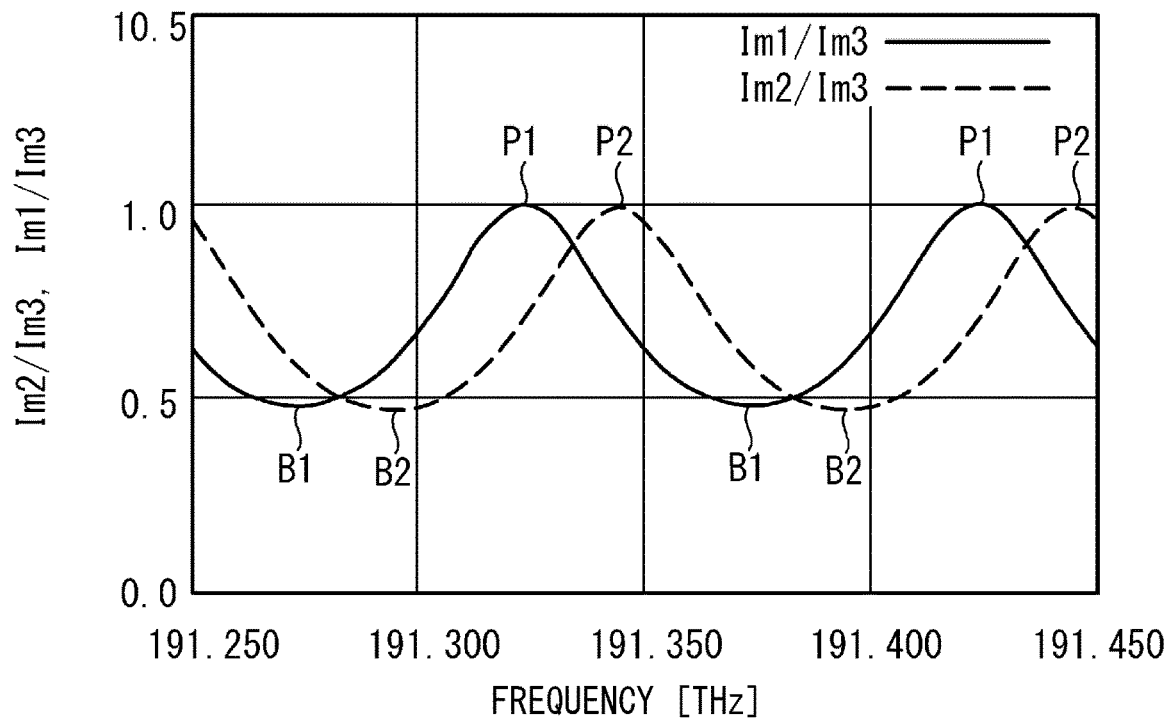
FIG. 11A illustrates the transmission characteristics of the etalon.
Figure 11B:
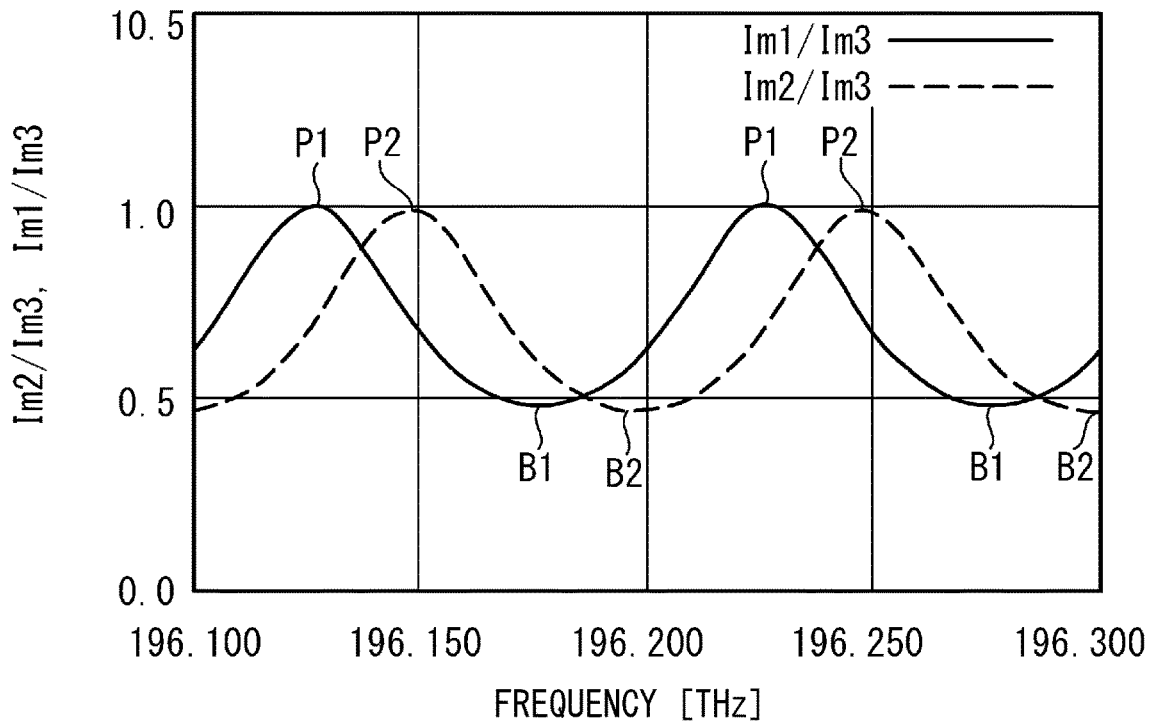
FIG. 11B illustrates the transmission characteristics of the etalon.

FIG. 11A and FIG. 11B illustrate the transmission characteristics of the etalon 24. The ratio Im1/Im3 and the ratio Im2/Im3 have the same period, and are shifted from each other by approximately one-quarter period. Thus, in the second embodiment, as in the first embodiment, stable wavelength control is possible.

In the second embodiment, the incidence angles of the light beams L1 and L2 to one etalon 24 are made to be different by the beam splitter 22 having two reflecting surfaces 22a and 22b that are nonparallel. The thickness between the surface 24e and the surface 24f is uniform, but the incidence angles of the light beams L1 and L2 in the respective parts of the surface 24e are different. Thus, the optical path length of the light beam L1 in the etalon 24 is less than the optical path length of the light beam L2 in the etalon 24. Hence, the optical path length of the part determined by the light beam L1 in the etalon 24 is less than the optical path length of the part determined by the light beam L2 in the etalon 24. In addition, the production tolerance and the variation in assembly are reduced, and therefore, stable wavelength control is possible.

The etalon 24 has a uniform thickness, and the respective refractive indexes to the light beams L1 and L2 of the etalon 24 are the same. Thus, the transmission characteristic can be controlled by adjusting mainly the angle θ2 between the reflecting surfaces 22a and 22b. Therefore, stable wavelength control is possible.

Third Embodiment

Figure 12:
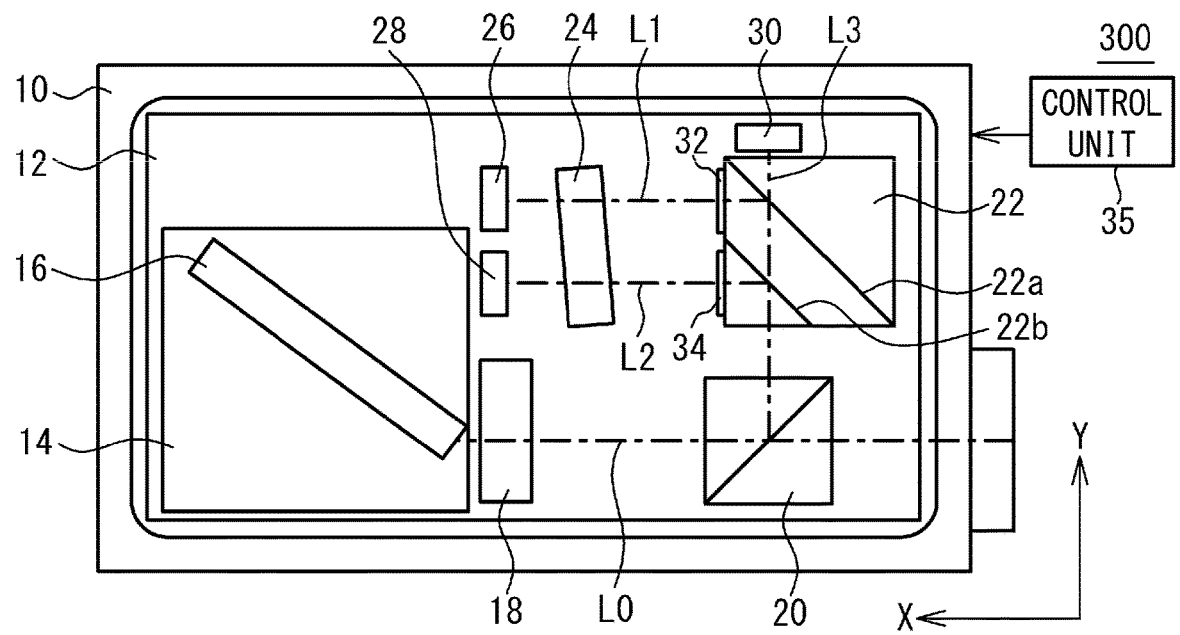
FIG. 12 is a plan view illustrating an optical semiconductor device in accordance with a third embodiment.

FIG. 12 is a plan view illustrating an optical semiconductor device 300 in accordance with a third embodiment. The description of the same components as those of the first and second embodiments is omitted. As illustrated in FIG. 12, the etalon 24 has a uniform thickness, and the beam splitter 22 has two reflecting surfaces 22a and 22b that are parallel to each other. The light beam L1 emitted from the reflecting surface 22a and the light beam L2 emitted from the reflecting surface 22b are parallel to each other.

Polarizers 32 and 34 are provided on the surface facing the etalon 24 of the beam splitter 22. In the X-axis direction, the polarizer 32 is located between the reflecting surface 22a and the etalon 24, and the polarizer 34 is located between the reflecting surface 22b and the etalon 24.

The light beam L1 of which the polarization state has changed by transmission through the polarizer (a first polarizer) enters the etalon 24. The light beam L2 of which the polarization state has changed by transmission through the polarizer 34 (a second polarizer) enters the etalon 24. The polarization state of the light beam L1 after transmission through the polarizer is different from the polarization state of the light beam L2 after transmission through the polarizer.

The etalon 24 is formed of an anisotropic crystal such as, for example, crystal, and has refractive indexes unique to respective polarization states of the incident beam. Since the light beams L1 and L2 have different polarization states, the refractive index to the light beam L1 of the etalon 24 is different from the refractive index to the light beam L2. Thus, the transmission characteristic of the etalon 24 to the light beam L1 is different from the transmission characteristic to the light beam L2. The third embodiment can reduce the production tolerance and the variation in assembly, thereby allowing stable wavelength control.

Table 3 lists examples of the incidence angles of the light beams L1 and L2 to the etalon 24, the thickness of the etalon 24, the refractive index of the etalon 24, and the reflectance of the etalon 24.

TABLE 3

| Light beam | L1 | L2 |
| --- | --- | --- |
| Incidence angle [°] | 1.73 | 1.73 |
| Thickness | 0.97 mm | 0.97 mm |
| Refractive index | 1.5443 | 1.544937 |
| Reflectance [%] | 24 | 24 |

As presented in Table 3, the incidence angles, the thicknesses (the optical path lengths), and the reflectances to the light beams L1 and L2 are the same. On the other hand, the refractive index to the light beam L2 is 1.544937, and is greater than 1.5443, which is the refractive index to the light beam L1. This configuration allows the transmission characteristic of the etalon 24 to the light beam L1 (corresponding to Im1/Im3) and the transmission characteristic of the etalon 24 to the light beam L2 (corresponding to Im2/Im3) to be adjusted to those illustrated in FIG. 13A and FIG. 13B.

Figure 13A:
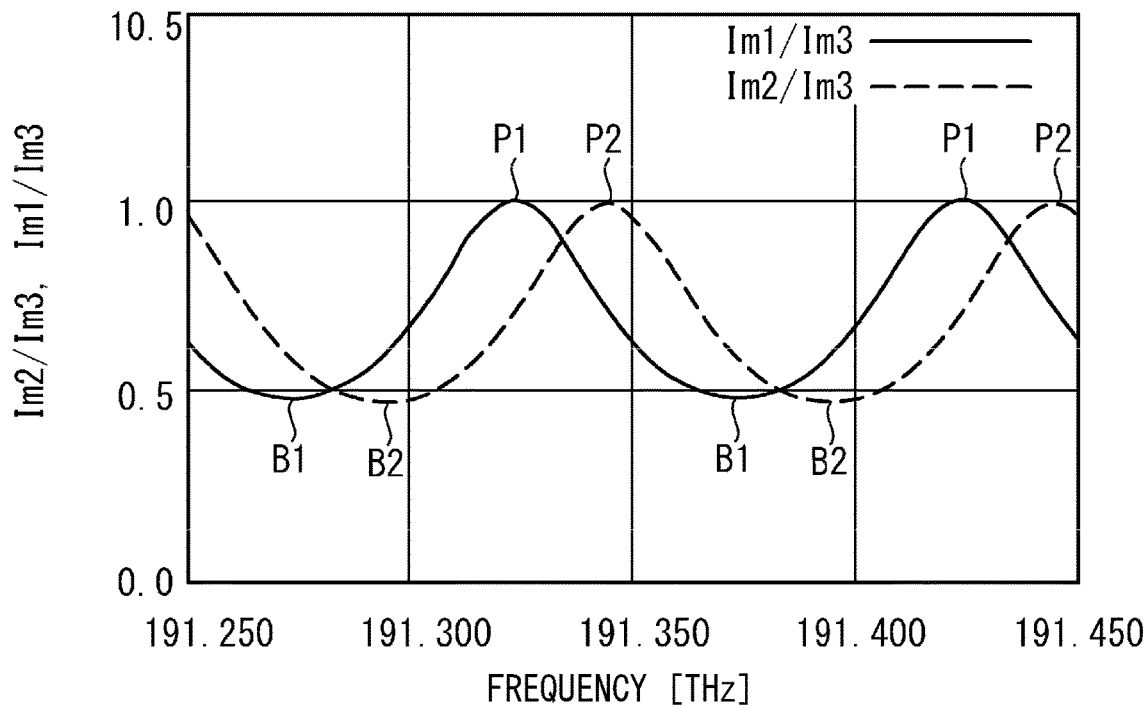
FIG. 13A illustrates the transmission characteristics of the etalon.
Figure 13B:
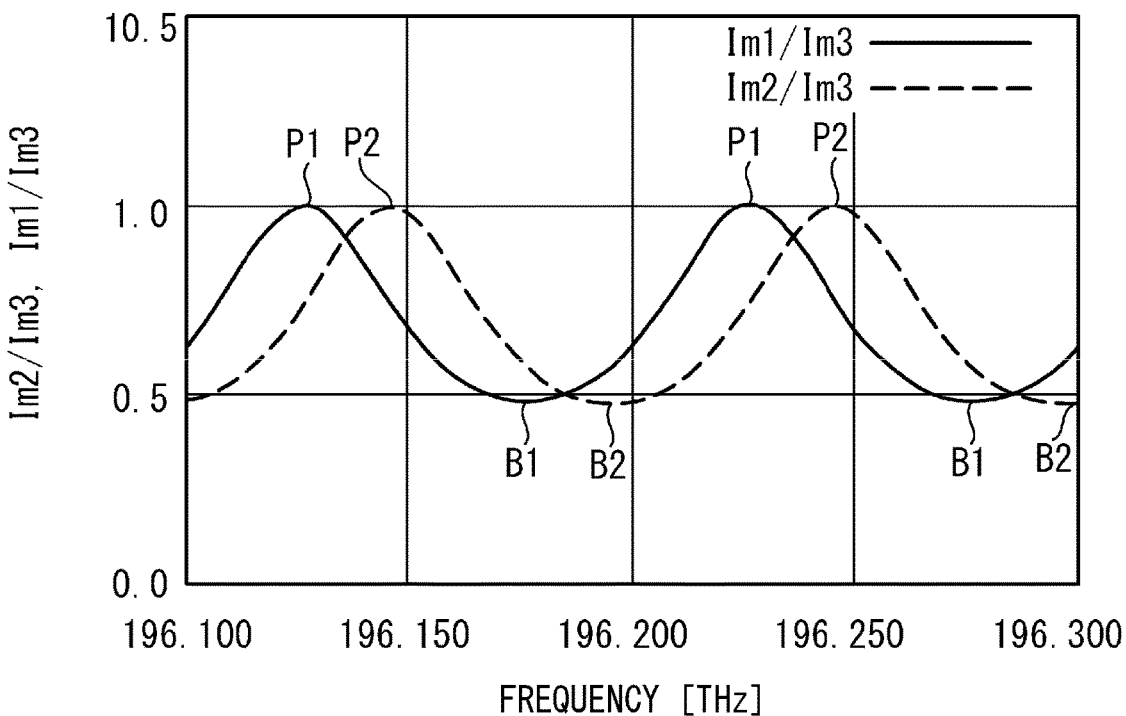
FIG. 13B illustrates the transmission characteristics of the etalon.

FIG. 13A and FIG. 13B illustrate the transmission characteristics of the etalon 24. The ratio Im1/Im3 and the ratio Im2/Im3 have the same period, and are shifted from each other by approximately one-quarter period. Thus, in the third embodiment, stable wavelength control is possible as in the first and second embodiments.

In the third embodiment, one etalon 24 that causes the birefringence and the polarizers 32 and 34 are used. Thus, the production tolerance and the variation in assembly are reduced. Therefore, stable wavelength control is possible.

The etalon 24 has a uniform thickness, and the beam splitter 22 has the reflecting surfaces 22a and 22b parallel to each other. The transmission characteristics can be controlled by adjusting the polarization states after transmission through the polarizers 32 and 34 and the refractive index of the etalon 24, and therefore, stable wavelength control is possible. The number of polarizers may be one, and at least one of the polarization states of the light beams L1 and L2 is changed. This is because the same effects can be obtained by making the polarization states of the light beams L1 and L2 different. To precisely adjust the polarization states, it is preferable to provide the polarizers 32 and 34 corresponding to the light beams L1 and L2, respectively.

Fourth Embodiment

Figure 14:
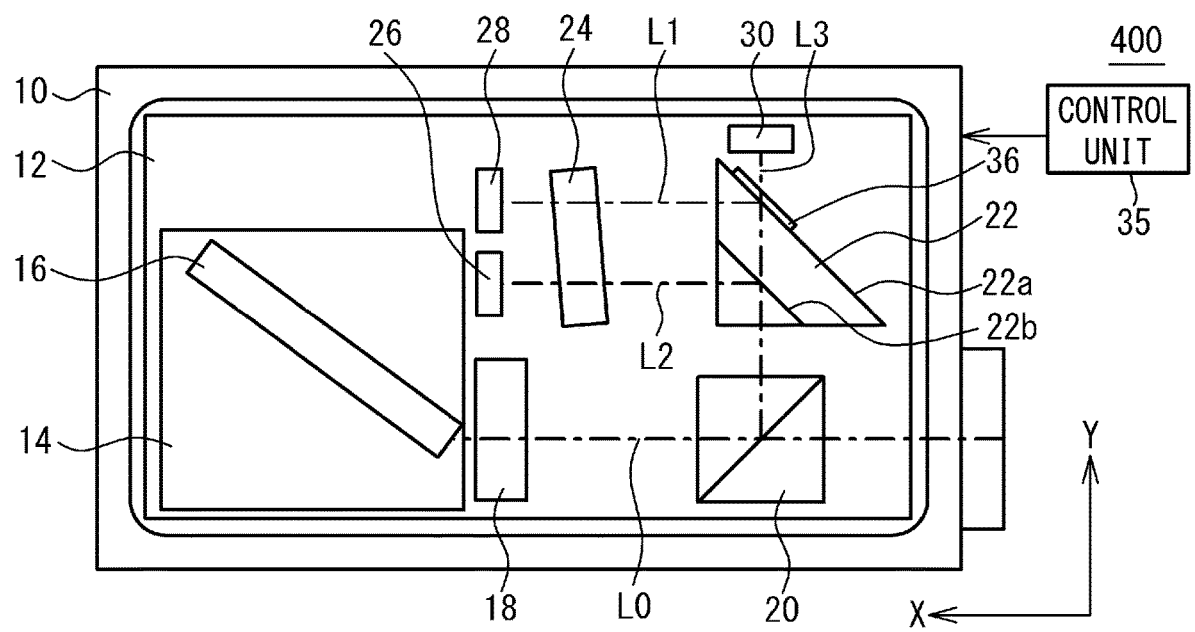
FIG. 14 is a plan view illustrating an optical semiconductor device in accordance with a fourth embodiment.

FIG. 14 is a plan view illustrating an optical semiconductor device 400 in accordance with a fourth embodiment. The description of the same components as those of the third embodiment is omitted. As illustrated in FIG. 14, the beam splitter 22 has two reflecting surfaces 22a and 22b parallel to each other, and a polarization reflector 36 is provided on the reflecting surface 22a. The polarization reflector 36 is, for example, a reflection type polarizing film, and changes the polarization state of a light beam and reflects the light beam. The two reflecting surfaces 22a and 22b reflect a part of a light beam and transmits another part of the light beam. The polarization reflector 36 reflects the light beam L1 of which the polarization state changes, and transmits the light beam L3 of which the polarization state changes.

The light beam L1 of which the polarization state has changed by reflection by the polarization reflector 36 enters the etalon 24. The polarization state of the light beam L1 is different from the polarization state of the light beam L2. The refractive index to the light beam L1 of the etalon 24 is different from the refractive index to the light beam L2. Thus, in the fourth embodiment, the transmission characteristic of the etalon 24 to the light beam L1 becomes different from the transmission characteristic to the light beam L2, and therefore, stable wavelength control becomes possible.

Fifth Embodiment

Figure 15A:
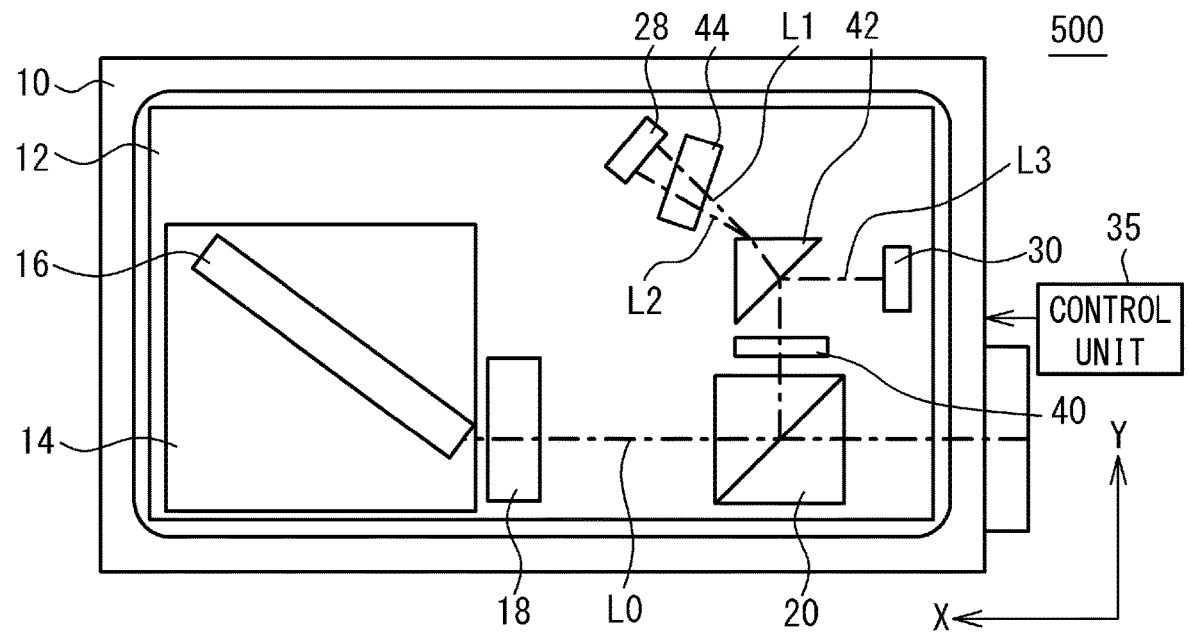
FIG. 15A is a plan view illustrating an optical semiconductor device in accordance with a fifth embodiment.
Figure 15B:
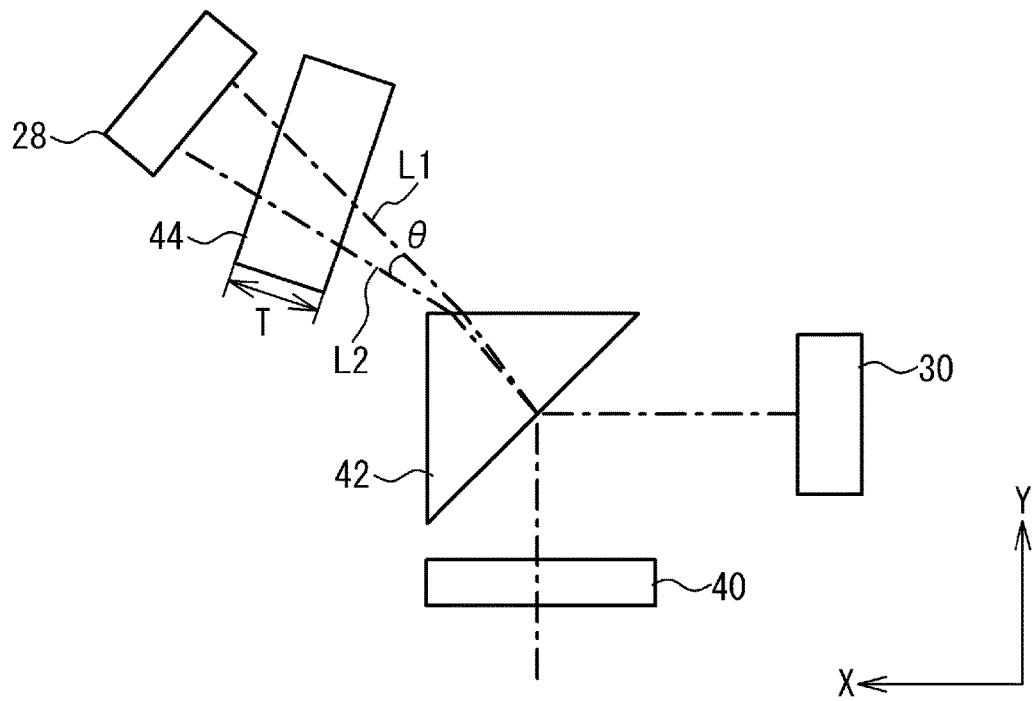
FIG. 15B is an enlarged view of the etalon and the beam splitter.

FIG. 15A is a plan view illustrating an optical semiconductor device 500 in accordance with a fifth embodiment, and FIG. 15B is an enlarged view around a variable polarizer 40 and a beam splitter 42. Chain lines represent light beams. As illustrated in FIG. 15A, the optical semiconductor device 500 includes the package 10, the TEC 12, the carrier 14, the wavelength tunable laser element 16, the lens holder 18, the beam splitter 20, the variable polarizer 40, the beam splitter 42, an etalon 44, and the light receiving elements 28 and 30. The control unit 35 is coupled to the wavelength tunable laser element 16, the light receiving elements 28 and 30, and the variable polarizer 40.

The lens holder 18 is located at the negative X side of the output end of the wavelength tunable laser element 16, and the beam splitter 20 is located at the negative X side of the lens holder 18. The variable polarizer 40 is located at the positive Y side of the beam splitter 20, and the beam splitter 42 is located at the positive Y side of the variable polarizer 40. The light receiving element 30 (a third detection unit) is located at the negative X side of the beam splitter 42. The etalon 44 is located at the positive X and positive Y sides of the beam splitter 42. The light receiving element 28 is located at the opposite side of the etalon 44 from the beam splitter 42.

The variable polarizer 40 is formed of, for example, an anisotropic crystal of a dielectric substance such as liquid crystal or lithium niobate (LiNbO$_3$). The variable polarizer 40 changes the polarization state of the incident beam L0 in accordance with the control signal input from the control unit 35.

The beam splitter 42 is formed of, for example, calcite or crystal, and is a prism that is an optical anisotropic crystal of which the optical properties differ depending on the direction of the crystal axis, and causes the birefringence of light. The beam splitter 42 has refractive indexes unique to respective polarization states of an incident beam. The beam splitter 42 refracts the light beam L0 of which the polarization state has been changed by the variable polarizer 40, and emits the light beams L1, L2, and L3.

When no control signal is input to the variable polarizer 40, the variable polarizer 40 causes the polarization state of the light beam L0 to be in a certain state (a first state). The beam splitter 42 refracts this beam L0, and emits the light beam L1 (a first light beam). When a control signal is input to the variable polarizer 40, the variable polarizer 40 causes the polarization state of the light beam L0 to be in another state (a second state). The beam splitter 42 refracts this beam L0, and emits the light beam L2 (a second light beam). Since the beam splitter 42 has different refractive indexes to the light beams having the polarization states different from each other, the emission direction of the light beam L1 and the emission direction of the light beam L2 are different from each other. Thus, as illustrated in FIG. 1B, the emission direction of the light beam L1 and the emission direction of the light beam L2 differ from each other by the angle θ. Thus, the optical path (a first optical path) of the light beam L1 in the etalon 44 and the optical path (a second optical path) of the light beam L2 in the etalon 44 have optical path lengths different from each other. The incident directions in which the light beams L1 and L2 enter the beam splitter 42 are also different from each other.

As illustrated in FIG. 1A and FIG. 1B, the etalon 44 is inclined against the X-axis and the Y-axis, and has a uniform thickness T. One of the surfaces faces the beam splitter 42, and the other one faces the light receiving element 28. The light beams L1 and L2 enter the etalon 44, and the etalon 44 transmits the light beams L1 and L2. The etalon 44 is formed of, for example, crystal, and the transmissivity periodically changes according to the wavelength of the incident beam.

The light receiving element 28 (first and second detection units) receives the light beams L1 and L2 that have passed through the etalon 44, outputs the electric current Im1 according to the incidence of the light beam L1, and outputs the electric current Im2 according to the incidence of the light beam L2. The light receiving element 30 receives the light beam L3 that is not transmitted through the etalon 44 and is emitted in the negative X direction, and outputs the photocurrent Im3. The photocurrent varies according to the intensity of the light beam. The ratio of the photocurrents Im1 and Im3 corresponds to the ratio of the intensities of the light beams L1 and L3, and the ratio of Im2 and Im3 corresponds to the ratio of the intensities of the light beams L2 and L3. The wavelength is controlled based on these ratios.

The fifth embodiment makes the optical path lengths of the light beam L1 and the light beam L2 different by making the incidence angles of the light beam L1 and the light beam L2 to the etalon 44 different. This enables to achieve the desired transmission characteristics as illustrated in FIG. 2A and FIG. 2B, and allows stable wavelength control.

In the fifth embodiment, the variable polarizer 40 changes the polarization state of the light beam L0, and the beam splitter 42 emits the light beams L1 and L2 in different directions according to the polarization states. Thus, the incidence angles and the optical path lengths are different between the light beams L1 and L2, and thus, the transmission characteristic of the etalon 44 to the light beam L1 becomes different from the transmission characteristic to the light beam L2. Therefore, stable wavelength control becomes possible.

Table 4 lists examples of the incidence angles of the light beams L1 and L2 to the etalon 44, the thickness of the etalon 44, the refractive index of the etalon 44, and the reflectance of the etalon 44.

TABLE 4

| Light beam | L1 | L2 |
| --- | --- | --- |
| Incidence angle [°] | 0 | 0.28 |
| Thickness [mm] | 0.97 | 0.97 |
| Refractive index | 1.5443 | 1.5443 |
| Reflectance [%] | 24 | 24 |

As presented in Table 4, the thicknesses, the refractive indexes, and the reflectances to the light beams L1 and L2 are the same. On the other hand, the incidence angle of the light beam L1 is, for example, 0°, and the incidence angle of the light beam L2 is, for example, 0.28°. As a result, the optical path lengths are also different from each other. This configuration allows the transmission characteristic of the etalon 44 to the light beam L1 (corresponding to Im1/Im3) and the transmission characteristic of the etalon 44 to the light beam L2 (corresponding to Im2/Im3) to be different from each other as illustrated in FIG. 2A and FIG. 2B.

As illustrated in FIG. 2A and FIG. 2B, in a range of 191.250 to 196.300 THz, the ratio Im1/Im3 and the ratio Im2/Im3 have the same period, and are shifted from each other by approximately one-quarter period in a range from, for example, 3/16 period to 5/16 period. Thus, at the frequencies at which the ratio Im1/Im3 is at the peak P1 or the bottom B1, the ratio Im2/Im3 exhibits a monotonic increase or a monotonic decrease. In this case, the wavelength is controlled using the ratio Im2/Im3. In addition, at the frequencies at which the ratio Im2/Im3 is at the peak P2 or the bottom B2, the ratio Im1/Im3 exhibits a monotonic increase or a monotonic decrease. In this case, the wavelength is controlled using the ratio Im1/Im3. As a result, stable wavelength control is possible.

The electric signal is input from the control unit 35 to the wavelength tunable laser element 16 to drive the wavelength tunable laser element 16, the electric signal is input to the variable polarizer 40 to change the polarization state of the light beam L0, the output electric currents of the light receiving elements 28 and 30 are detected, and the wavelength is controlled. Specifically, the control unit 35 obtains the transmissivity corresponding to the target wavelength from the memory, and inputs the electric signal to the variable polarizer 40 to achieve the obtained transmissivity. Thus, the desired polarization state is obtained by the variable polarizer 40, and stable wavelength control becomes possible.

As illustrated in FIG. 15A and FIG. 15B, the fifth embodiment uses one etalon 44, the variable polarizer 40, and the beam splitter 42, and therefore has a simpler structure than the second comparative example. Thus, the production tolerance and the variation in assembly can be reduced. Therefore, the incidence angles and the optical path lengths of the light beams L1 and L2 can be determined more precisely.

Since the variable polarizer 40 is formed of liquid crystal or a dielectric substance, the rotation angle of the polarization direction is variable. For example, the variable polarizer 40 can change the polarization state of the outgoing beam to two or more states according to the control signal input from the control unit 35. The beam splitter 42 refracts the light beams in the different directions according to the polarization states, and emits the light beams. Thus, the transmission characteristics of the etalon 44 illustrated in FIG. 2A and FIG. 2B are obtained. Since the light beams having different polarization states are emitted by one variable polarizer 40, the production tolerance and the variation in assembly are reduced, and stable wavelength control is possible.

The beam splitter 42 emits the light beams L1, L2, and L3. Thus, the wavelength can be controlled based on the ratio of the intensities of the light beams L1 and L3 (Im1/Im3) and the ratio of the intensities of the light beams L2 and L3 (Im2/Im3).

At least, the beam splitter 42 changes the emission direction according to the polarization state of a light beam. Preferably, the beam splitter 42 is a prism that is formed of an anisotropic and causes the birefringence of a light beam. For example, the beam splitter 42 exhibits good birefringence when the beam splitter 42 is formed of calcite or crystal. One beam splitter 42 causes the birefringence of the light beams with different polarization states emitted from the variable polarizer 40, and emits the light beams L1 and L2. Thus, the production tolerance and the variation in assembly are reduced, and stable wavelength control is possible.

The etalon 44 has a uniform thickness, and the refractive indexes of the etalon 44 to the light beams L1 and L2 are the same. Thus, the transmission characteristic can be controlled with the emission directions of the light beams L1 and L2 from the beam splitter 42. This allows stable wavelength control.

The variable polarizer 40 and the beam splitter 42 are located at the negative X side (the side toward which the laser beam is emitted) of the wavelength tunable laser element 16. The etalon 44 is located closer to the wavelength tunable laser element 16 than the variable polarizer 40 and the beam splitter 42 along the X-axis. The laser beam is emitted in the negative X direction from the wavelength tunable laser element 16, and propagates from the beam splitter 20 to the etalon 44 in the positive X direction. Thus, it is not necessary to make the package 10 long in, for example, the X direction, and therefore, the optical semiconductor device 500 can be reduced in size.

Although some embodiments of the present disclosure have been described in detail, the present invention is not limited to the specific embodiments but may be varied or changed within the scope of the present invention as claimed.

DESCRIPTION OF LETTERS OR NUMERALS 10 package
12 TEC
14 carrier
16 wavelength tunable laser element
18 lens holder
20, 21, 22, 23, 42 beam splitter
22a, 22b reflecting surface
24, 25, 44 etalon
26, 28, 30 light receiving element
32, 34 polarizer
36 polarization reflector
40 variable polarizer
100, 200, 300, 400, 500 optical semiconductor device

The invention claimed is:

1. An optical semiconductor device comprising:
   a wavelength tunable laser element;
   a beam splitter that splits an outgoing beam of the wavelength tunable laser element into a first light beam and a second light beam, and outputs the first light beam and the second light beam;
   a polarizer that makes a polarization state of one of the first light beam and the second light beam different from a polarization state of the other of the first light beam and the second light beam by changing a polarization state of at least one of the first light beam and the second light beam; and
   an etalon that transmits the first light beam and the second light beam that have passed through the polarizer, wherein
   the etalon is composed of a material that has a refractive index unique to a polarization state of a light beam entering the etalon.

2. The optical semiconductor device according to claim 1, wherein
   the polarizer includes a first polarizer and a second polarizer, and
   the first polarizer changes a polarization state of the first light beam, the second polarizer changes a polarization state of the second light beam to a polarization state different from that of the first light beam.

3. The optical semiconductor device according to claim 1, wherein
   the beam splitter includes a reflecting surface that reflects the outgoing beam, and
   the polarizer is provided on the reflecting surface.

4. The optical semiconductor device according to claim 3, wherein
   the reflecting surface transmits a part of the outgoing beam to output a third light beam.

* * * * *